United States Patent
Koriyama et al.

(10) Patent No.: US 7,102,458 B2
(45) Date of Patent: Sep. 5, 2006

(54) HIGH-FREQUENCY LINE-WAVEGUIDE CONVERTER HAVING THE HF LINE TERMINATED WITHIN AN OPENING PORTION

(75) Inventors: Shinichi Koriyama, Kokubu (JP); Hiroshi Uchimura, Kokubu (JP)

(73) Assignee: Kyocera Corporation, Kyoto (JP)

( * ) Notice: Subject to any disclaimer, the term of this patent is extended or adjusted under 35 U.S.C. 154(b) by 124 days.

(21) Appl. No.: 10/443,447

(22) Filed: May 22, 2003

(65) Prior Publication Data
US 2003/0231078 A1 Dec. 18, 2003

(30) Foreign Application Priority Data
May 23, 2002 (JP) ............. P2002-149240
Jun. 25, 2002 (JP) ............. P2002-185119

(51) Int. Cl.
*H01P 5/107* (2006.01)
(52) U.S. Cl. ............. 333/26; 333/33
(58) Field of Classification Search ........ 333/26, 333/33
See application file for complete search history.

(56) References Cited

U.S. PATENT DOCUMENTS 5,793,263 A    8/1998  Pozar ............. 333/26
5,903,239 A *  5/1999  Takahashi et al. ... 343/700 MS
6,239,669 B1 * 5/2001  Koriyama et al. ......... 333/26
6,870,438 B1 * 3/2005  Shino et al. ............. 333/26

FOREIGN PATENT DOCUMENTS

| DE | 4-208058 | 9/1993 |
| EP | 1 014 471 | 6/2000 |
| JP | 6-112708 | 4/1994 |
| JP | 8-139504 | 5/1996 |
| WO | 96/27913 | 9/1996 |

* cited by examiner

*Primary Examiner*—Benny Lee
(74) *Attorney, Agent, or Firm*—Hogan & Hartson LLP

(57) ABSTRACT

An object of the invention is to provide a high-frequency line-waveguide converter in which a distance between a grounding conductor and a radiating conductor and a thickness of a dielectric layer of a high-frequency line can be freely set. A high-frequency line-waveguide converter for converting a high-frequency line to a waveguide comprises a high-frequency line including a first dielectric layer; a line conductor; and a grounding conductor; an opening portion of the grounding conductor; a second dielectric layer; a radiating conductor; a connecting conductor; a shielding conductor portion; and a waveguide.

4 Claims, 9 Drawing Sheets

HIGH-FREQUENCY LINE-WAVEGUIDE CONVERTER HAVING THE HF LINE TERMINATED WITHIN AN OPENING PORTION

BACKGROUND OF THE INVENTION

1. Field of the Invention

The present invention relates to a high-frequency line-waveguide converter for converting a high-frequency line which is used in a microwave or millimeter wave band and constitutes a high-frequency circuit (such as a strip line, a microstrip line, a coplanar line, or a coplanar line having a grounding conductor) to a waveguide, the high-frequency line-waveguide converter having succeeded in facilitating system mounting by providing connection between a high-frequency circuit and an antenna, or between high-frequency circuits, through a waveguide.

2. Description of the Related Art

In recent years, as we move into the so-called advanced information age, signals in an increasingly wider range of frequencies have been sought after for information transmission. Consequently, studies have been conducted as to the use of signals falling in a range from micro-wave-band frequencies (1 to 30 GHz) to millimeter-wave-band frequencies (30 to 300 GHz). For example, versatile systems employing high-frequency signals in millimeter-wave-band frequencies, such as a vehicular radar, have been proposed to date.

However, such a high-frequency system poses the following problem. In its high-frequency line constituting a circuit, high-frequency signals are significantly attenuated due to the high frequency level. For example, in a case where the high-frequency line is built as a micro-strip line, a dielectric loss as observed in the dielectric substrate is increased proportionately with a frequency (assuming that the dielectric loss tangent is independent of the frequency), and also a conductor loss as observed in the line conductor is increased proportionately with the square root of the frequency. As is understood from this fact, even in the micro-strip line, when the usable frequency is as high as 1 GHz to 10 GHz, the dielectric loss becomes 10 times higher, and the conductor loss becomes approximately 3.2 times higher. To compensate for these losses, it is necessary to make heavy use of expensive high-frequency components that are lower in noise but higher in efficiency and gain, resulting in the system as a whole being expensive.

It has been known that, as compared to such a high-frequency line having a micro-strip line structure, a waveguide incurs less transmission loss of high-frequency signals. For example, in a waveguide WR-28 (EIA (Electronic Industries Alliance) standard) which is operated at a frequency band of 26 to 40 GHz, a loss is expected to be approximately 0.005 dB/cm at 40 GHz. This figure is far smaller than a value of a loss as observed in a micro-strip line composed of an alumina ceramic substrate: approximately 1 dB/cm. These are the following reasons for this. As compared to an ordinary high-frequency line (generally designed with an impedance of 50Ω), a waveguide has a greater impedance (generally designed with an impedance of the order of 500Ω, though it varies with frequencies). In the waveguide, the effect of electric field energy propagating through a dielectric substance is more significant relative to that of signal energy to be transmitted, and, used as the dielectric substance is air having a dielectric tangent of substantially nil. Moreover, a current flowing through the tubular wall of the waveguide, which gives rise to relatively weak magnetic energy, can be kept low. Further, since the current flows through a relatively wide area in the tubular wall of the waveguide, the resultant electrical resistance decreases, resulting in the conductor loss being reduced.

Besides, two or more waveguides are generally coupled to each other by a screw. Therefore, their attachment and detachment can be made with ease. For example, in a case where a waveguide is used to provide connection between a high-frequency circuit module and an antenna, examination is conducted, before assembly, on each of the components using a waveguide port, so that an RF front end is assembled using a combination of conforming components. As a result, the manufacturing yield can be enhanced. With this being the situation, in most of conventional front ends, a waveguide has been used to achieve transmission between a high-frequency circuit module and an antenna, in consideration of its long transmission distance.

FIG. 9 is a sectional view for explaining the structure of the RF front end. According to FIG. 9, a front end 60 is constructed by connecting a module 61 to an antenna 62 via a waveguide member 63. The module 61 is mounted on a metal chassis 65 having a waveguide opening 64. Moreover, the front end 60 includes a micro-strip substrate 66 and a high-frequency line-waveguide converter 68. In the micro-strip substrate 66 is formed a micro-strip line acting as a high-frequency line. The high-frequency line-waveguide converter 68 is composed of the waveguide opening portion 64 and a waveguide composed of a short-circuit terminating member 67. Connected to the micro-strip line of the micro-strip substrate 66 by wire bonding is a wiring board 69 having high-frequency components mounted therein.

In the front end 60, the high-frequency line-waveguide converter 68 is constructed as follows. At a distance of ¼ times of a signal wavelength of a high-frequency signal from the short-circuit terminating face of the short-circuit terminating member 67, a probe formed on the micro-strip substrate 66 (the portion in which a line conductor is extended but no grounding conductor is formed) is inserted, from the side face of the waveguide, by a length of substantially ¼ times of a signal wavelength. In the waveguide, this probe functions as an antenna for radiating a high-frequency signal as an electromagnetic wave into the waveguide. Half of the electromagnetic wave radiated into the waveguide is directly transmitted to the waveguide member 63 located below, while the other half is transmitted toward the short-circuit terminating member 67 located above. The electromagnetic wave transmitted toward the short-circuit terminating member 67 is phase-inverted at the short-circuit terminating face so as to be totally reflected. The totally reflected electromagnetic wave returns to the probe portion and is then combined with an electromagnetic wave which is directly radiated downwardly from the probe. At this time, by adjusting the distance between the probe and the short-circuit terminating face to ¼ times of a signal wavelength of a high-frequency signal, the length of the double optical path (the probe—the short-circuit terminating face—the probe) is one-half wavelength long. Thus, the electromagnetic wave reflected from the short-circuit terminating face and the electromagnetic wave radiated directly from the probe are in phase opposition due to the optical-path difference. Eventually, the electromagnetic wave reflected from the short-circuit terminating face is phase-inverted when reflected from the short-circuit terminating face, and is then further phase-inverted due to the optical-path difference. Consequently, the electromagnetic wave reflected from the short-circuit terminating face is identical in phase with the electromagnetic wave directly radiated downwardly from the probe, and is then transmitted to the waveguide member 63 located below.

At this time, in order for the probe to function as an antenna, the length of its part inserted into the waveguide needs to be exactly ¼ times of a signal wavelength. Moreover, in order for the electromagnetic wave which has been radiated upwardly from the probe and reflected from the short-circuit terminating face to be identical in phase with the electromagnetic wave radiated downwardly from the probe, the distance between the probe and the short-circuit terminating face needs to be exactly ¼ times of a signal wavelength. Hence, the characteristics are significantly varied depending on the position of the micro-strip substrate 66 acting as an antenna or the height of the short-circuit terminating member 67.

The high-frequency line-waveguide converter 68 is formed on the metal chassis 65, together with the wiring board 69, by assembly. Therefore, when the high-frequency line-waveguide converter incurs a significant conversion loss due to positional deviation of each component, all of the constituent components become useless. This gives rise to a problem of the assembly yield being low.

To solve such a problem, for example, Japanese Unexamined Patent Publication JP-A 6-112708 (1994) discloses a waveguide-planer line converter which is constructed by forming, on a dielectric substrate, a grounding conductor acting as a short-circuit terminal of a waveguide and a radiating conductor acting as an antenna. In the construction disclosed in JP-A 6-112708, the distance between the short-circuit terminal of the waveguide and the radiating conductor is adjusted to ¼ times of a signal wavelength of a high-frequency signal. This structure is the same as that of conventional converters.

However, this construction poses the following problems. The dielectric substrate for adjusting the distance from the short-circuit terminal of the waveguide to the radiating conductor and the dielectric substrate for constituting a micro-strip line are identical, and the thickness of the dielectric substrate needs to be ¼ times a signal wavelength. This requires impedance adjustment for the micro-strip line be conducted solely by changing the conductor width of the line conductor. Thus, to set the impedance of the micro-strip line at a certain value, when the substrate is made thick, the conductor width of the line conductor needs to be increased, whereas when the substrate is made thin, the conductor width needs to be decreased. Consequently, depending on signal frequencies, a difference in conductor width is caused between the line conductor and its counterpart line conductor of the micro-strip line that are connected to each other, resulting in occurrence of signal reflection.

Moreover, since this converter is so designed that the thickness of the dielectric substrate is adjusted to ¼ times of a signal wavelength, when the signal frequency is low, the thickness of the dielectric substrate is increased, whereas when the signal frequency is high, the thickness is decreased. Thus, when the signal frequency is high, the dielectric substrate is so thin that its strength is decreased. For example, in a case where the signal frequency is 76 GHz and the relative dielectric constant of the dielectric substrate is 9, the thickness of the dielectric substrate is given as approximately 0.33 mm. In this case, depending on materials used for the substrate, there is a possibility that the dielectric substrate is deformed or broken.

Further, in this converter, part of the radiating conductor that functions as an antenna is inserted into the waveguide. Thus, if the waveguide-planer line converter undergoes positional deviation and this causes a change in the length of the part functioning as an antenna, the antenna characteristics are varied, resulting in degradation of the conversion efficiency of the waveguide-planer line converter.

In addition, for proper use of this converter, a concavity needs to be provided in part of a waveguide opening formed in a metal-made casing, to prevent occurrence of short-circuiting in the radiating conductor. This means that a portion which should act as the tubular wall of the waveguide is partly missing. Thus, an electromagnetic wave leaks from this concavity, resulting in degradation of the conversion efficiency. Besides, since formation of such a concavity is absolutely necessary, the waveguide and the casing need to be subjected to extra processing.

To solve such problems, for example, a microstrip-waveguide converter is disclosed in International Patent Application published under the PCT as International Publication No. WO96/27913 (1996). In this construction, a micro-strip line is formed on a top surface of a dielectric substrate, and a slot, acting as an antenna, is formed on a grounding conductor layer of a bottom surface of the substrate. This micro-strip-waveguide converter disclosed in WO96/27913 is so designed that the thickness of the dielectric substance, from the slot to the waveguide, is adjusted to ¼ times of a signal wavelength of a high-frequency signal. In this case, the difference in impedance between the slot and the waveguide is compensated for by a quarter-wave matching device constituted by a dielectric substance.

According to this construction, an electromagnetic wave emitted from the slot is reflected from an interface between the dielectric-substance matching device and the waveguide, and is then reflected from the grounding conductor layer carrying the slot, and eventually returns to the interface between the matching device and the waveguide. At this time, by adjusting the thickness of the matching device to ¼ times of a signal wavelength, the difference in optical path between the electromagnetic wave reflected from the interface and returned (reflected wave) and the electromagnetic wave transmitted directly to the interface from the slot (direct wave) becomes one-half signal wavelength long. Since the reflected wave is phase-inverted when reflected from the grounding conductor layer, at the interface, the direct and reflected waves are in phase and mutually intensified, and are then transmitted to the waveguide.

According to this conversion structure, the conversion characteristics are varied greatly with the thickness of the matching device. However, in this case, since the matching device is formed integrally in the dielectric substrate, variation in the thickness of the dielectric substance can be minimized. Accordingly, the variation of the conversion characteristics can be suppressed. Moreover, by covering the micro-strip side of the dielectric substrate with a cap, not only it is possible to achieve conversion to a waveguide, but it is also possible to achieve hermetic sealing of the micro-strip side.

In this structure, the high-frequency line and the slot are coupled to each other by exploiting electromagnetic coupling between different layers. This electromagnetic coupling, together with the above-described matching device, plays a key role in conversion action. However, the characteristics of the electromagnetic coupling are varied with the dimension of the slot and the length of the stub (part of the high-frequency line jutting from the slot), that is, varied with the relative positional relationship between the high-frequency line and the slot. Hence, in this structure, the conversion characteristics are varied greatly with the dimension of the slot and the length of the stub. Since the high-frequency line and the slot are arranged on different layers, the length of the stub, which is determined in accordance with the relative positional relationship therebetween, is likely to change. This gives rise to a problem of the conversion characteristics being varied easily.

Moreover, in this structure, since the slot is arranged in the dielectric substrate, neither the length and width of the slot nor the length of the stub can be examined externally with ease. This makes it difficult to stabilize the characteristics by conducting an examination.

SUMMARY OF THE INVENTION

The invention has been devised in view of the above-described problems with the conventional art, and accordingly its one object is to provide a high-frequency line-waveguide converter in which a distance between grounding and radiating conductors is so determined that high-frequency line-waveguide conversion efficiency is enhanced; a thickness of a dielectric layer can be set freely for proper impedance adjustment to the high-frequency line; and no extra processing is required in an opening of the waveguide.

Another object of the invention is to provide a high-frequency line-waveguide converter which provides high conversion efficiency but incurs less variation in conversion characteristics.

The invention provides a high-frequency line-waveguide converter for converting a high-frequency line to a waveguide, comprising:

a high-frequency line including a first dielectric layer; a line conductor disposed on one surface of the first dielectric layer; and a grounding conductor disposed on the other opposite surface of the first dielectric layer;

an opening portion formed in the grounding conductor so as to face one end of the line conductor;

a second dielectric layer stacked on the other surface of the first dielectric layer;

a radiating conductor disposed on the other surface of the second dielectric layer so as to be opposite one end of the line conductor;

a connecting conductor passing through the opening portion of the grounding conductor and penetrating through the first and second dielectric layers, for providing electrical connection between one end of the line conductor and the radiating conductor;

a shielding conductor portion disposed on a side surface or in an interior of the second dielectric layer so as to surround part of the connecting conductor that passes through the second dielectric layer, and the radiating conductor; and a waveguide.

According to the invention, the high-frequency line-waveguide converter is composed of: the opening portion formed in the grounding conductor so as to be opposite one end of the line conductor; the second dielectric layer stacked on the other surface of the first dielectric layer; the radiating conductor disposed on the other surface of the second dielectric layer so as to face one end of the line conductor; the connecting conductor which passes through the opening portion of the grounding conductor and penetrates through the first and second dielectric layers, for providing electrical connection between one end of the line conductor and the radiating conductor; and the shielding conductor portion disposed on the side surface or in the interior of the second dielectric layer so as to surround part of the connecting conductor that passes through the second dielectric layer, and the radiating conductor. In this construction, the thickness of the dielectric layer constituting the high-frequency line can be adjusted in accordance with the thickness of the first dielectric layer, and also the distance between the radiating conductor and the grounding conductor, acting as the short-circuit terminal of the waveguide, can be adjusted in accordance with the thickness of the second dielectric layer. As a result, the thickness of the second dielectric layer can be so adjusted that the high-frequency line-waveguide conversion efficiency is enhanced (for example, adjusted to substantially ¼ times a signal wavelength of a high-frequency signal). Besides, the thickness of the dielectric layer constituting the high-frequency line can be freely selected regardless of a signal frequency. This helps facilitate impedance adjustment. Thus, the width of the line conductor can be so set as to conform to the width of the line conductor of the external high-frequency line, whereby making it possible to reduce a signal reflection as observed in the connecting region. Further, in a case where the signal frequency is increased (signal wavelength is decreased), even if the thickness of the second dielectric layer is reduced to enhance the high-frequency line-waveguide conversion efficiency, since the thickness of the entire converter is equal to the sum of the thicknesses of the first and second dielectric layers, it does not happen that the converter is made unduly thin as a whole. Thus, degradation of its strength can be prevented.

In the invention, it is preferable that the shielding conductor portion is constituted by a plurality of shielding through conductors disposed in the interior of the second dielectric layer.

According to the invention, by composing the shielding conductor portion of a plurality of shielding through conductors disposed in the interior of the second dielectric layer, the shielding through conductors can be formed concurrently with the connecting conductor during fabrication of the high-frequency line-waveguide converter. This helps facilitate production of the high-frequency line-waveguide converter. Moreover, the region of the second dielectric layer that is surrounded by the shielding through conductors can be shaped arbitrarily. Thus, for example, even if unnecessary resonance occurs in the region of the second dielectric layer that is surrounded by the shielding through conductors, the unnecessary resonance can be shifted to outside the signal conversion band by adjusting the arrangement of the shielding conductor portion.

In the invention, it is preferable that a thickness of the second dielectric layer is adjusted to substantially ¼ times of a wavelength of a signal transmitted through the high-frequency line.

According to the invention, By adjusting the thickness of the second dielectric layer to substantially ¼ times of a wavelength of a signal transmitted through the high-frequency line, the distance between the radiating and grounding conductors becomes substantially quarter times as long as the signal wavelength, and the length of the double optical path, through which an electromagnetic wave radiated from the radiating conductor toward the grounding conductor is totally reflected from the grounding conductor and then returns to the radiating conductor, becomes substantially one-half times as long as the signal wavelength. Accordingly, the returned wave has been phase-inverted. Being subjected to phase inversion when totally reflected from the grounding conductor, the wave becomes identical in phase with the electromagnetic wave radiated from the radiating conductor directly toward the waveguide. These waves are combined with each other, so that the signal is efficiently transmitted to the waveguide.

In the invention, it is preferable that the connecting conductor is connected to the radiating conductor at a position offset from a center thereof.

According to the invention, by connecting the connecting conductor to the radiating conductor at a position offset from the center thereof, the radiating conductor is separated by the connecting conductor into two portions having different lengths, and the electromagnetic wave radiated from the longer portion of the radiating conductor is more intense than that radiated from the shorter portion. Upon this difference in intensity, a high-frequency signal can be intensely radiated, as an electromagnetic wave, into the waveguide accordingly; wherefore the signal can be efficiently transmitted to the waveguide.

In the invention, it is preferable that the first and second dielectric layers are each made of at least one of inorganic dielectric materials selected from the group consisting of aluminum oxide ceramics, aluminum nitride ceramics, and glass ceramic materials.

According to the invention, the first and second dielectric layers are each made of at least one of inorganic dielectric materials selected from the group consisting of aluminum oxide ceramics, aluminum nitride ceramics, and glass ceramic materials. Since such a material has a small dielectric loss tangent and lends itself to hermetic sealing of the mounted high-frequency components, the reliability of the high-frequency components can be enhanced.

In the invention, it is preferable that the shielding through conductors are located inwardly relative to the opening of the waveguide.

According to the invention, since the shielding through conductors are located inwardly relative to the opening of the waveguide, no unnecessary resonance is caused therein. Moreover, the shielding through conductors can be formed in the interior of the second dielectric layer concurrently with the connecting conductor. This eliminates the need for an extra process to form the shielding conductor portion on the side surface of the second dielectric layer. Besides, since there is no need to conform the contour of the second dielectric layer to the opening of the waveguide, the high-frequency line-waveguide converter can be produced with ease. Further, the region of the second dielectric layer that is surrounded by the shielding conductor portion can be shaped arbitrarily. Thus, for example, even if unnecessary resonance occurs in the region of the second dielectric layer that is surrounded by the shielding conductor portion, the unnecessary resonance can be shifted to outside the signal conversion band by adjusting the arrangement of the shielding conductor portion.

According to the invention, there is provided the high-frequency line-waveguide converter in which the distance between the grounding and radiating conductors is so determined that the high-frequency line-waveguide conversion efficiency is enhanced; the thickness of the dielectric layer can be set freely for proper impedance adjustment to the high-frequency line; and no extra processing is required in the opening of the waveguide.

The invention further provides a high-frequency line-waveguide converter comprising:

a high-frequency line including a dielectric layer; a line conductor disposed on one surface of the dielectric layer; and a grounding conductor layer disposed on the same surface so as to surround one end of the line conductor;

a slot formed on the grounding conductor layer substantially perpendicularly to one end of the line conductor, the slot being coupled to the line conductor;

a shielding conductor portion disposed on a side surface or in an interior of the dielectric layer so as to surround one end of the line conductor and the slot; and a waveguide formed on the other opposite surface of the dielectric layer, so that its opening faces one end of the line conductor and the slot, the waveguide being electrically connected to the shielding conductor portion.

According to the invention, the high-frequency line-waveguide converter includes a high-frequency line and a slot. The high-frequency line is composed of a dielectric layer; a line conductor disposed on the one surface of the dielectric layer; and a grounding conductor layer disposed on the same surface so as to surround one end of the line conductor. The slot is formed on the grounding conductor layer substantially perpendicularly to one end of the line conductor, and is coupled to the line conductor. In this construction, the line conductor and grounding conductor layer constituting the high-frequency line, and the slot can be formed on the same plane. As a result, the relative position between the high-frequency line and the slot can be designed with high accuracy. Thus variation in the electromagnetic coupling characteristics between the high-frequency line and the slot can be minimized, resulting in advantages in enhancing the conversion efficiency of the high-frequency line-waveguide converter and in minimizing variation in the conversion characteristics.

In the invention, it is preferable that the shielding conductor portion is constituted by a plurality of shielding through conductors disposed in the interior of the dielectric layer.

According to the invention, by composing the shielding conductor portion of a plurality of shielding through conductors disposed in the interior of the dielectric layer, the shielding through conductors can be formed concurrently with the line conductor and the grounding conductor layer during fabrication of the high-frequency line-waveguide converter. This helps facilitate production of the high-frequency line-waveguide converter. Moreover, the region of the dielectric layer that is surrounded by the shielding through conductors can be shaped arbitrarily. Thus, for example, even if unnecessary resonance occurs in the region of the dielectric layer that is surrounded by the shielding through conductors, the unnecessary resonance can be shifted to outside the signal conversion band by adjusting the arrangement of the shielding conductor portion.

In the invention, it is preferable that a thickness of the dielectric layer is adjusted to substantially $(2n-1)/4$ times ($n$=natural number) of a wavelength a signal transmitted through the high-frequency line.

According to the invention, by adjusting the thickness of the dielectric layer to substantially ¼ times a wavelength of a signal transmitted through the high-frequency line, the distance between the slot and the interface between the dielectric layer and the waveguide becomes substantially quarter times as long as the signal wavelength. The difference in optical path between the reflected wave, which has been emitted from the slot, reflected from the interface between the dielectric layer and the waveguide, reflected once again from the grounding conductor layer carrying the slot, and returned to the interface, and the direct wave which has been transmitted from the slot directly to the interface, becomes one-half times as long as the signal wavelength. Since the reflected wave is phase-inverted when reflected from the grounding conductor layer, at the interface, the direct and reflected waves are in phase and mutually intensified, so that the signal is efficiently transmitted to the waveguide. At this time, by adjusting the thickness of the dielectric layer to (2n−1)/4 times (n=natural number) a signal wavelength, the optical-path difference between the reflected and direct waves becomes (n−1)/2 times a signal wavelength. Note that an optical-path difference of n-times as long as a signal wavelength is equal to absence of an optical-path difference. Thus, the optical-path difference becomes substantially one-half times as long as the signal wavelength, thereby achieving the same effect as described above.

According to the invention, by adjusting the thickness of the dielectric layer to substantially (2n−1)/4 times (n=natural number) a wavelength of a signal transmitted through the high-frequency line, the distance between the slot and the interface between the dielectric layer and the waveguide becomes substantially (2n−1)/4 times as long as the wavelength, and the length of the double optical path, through which the wave reflected from the interface between the dielectric layer and the waveguide (reflected wave) is totally reflected from the grounding conductor layer and then returns to the interface, becomes substantially one-half times as long as signal wavelength. Accordingly, the returned wave has been phase-inverted. Being subjected to phase inversion when totally reflected from the grounding conductor layer, the reflected wave becomes identical in phase with the direct wave transmitted from the slot directly toward the interface. These waves are combined with each other, so that the signal is efficiently transmitted to the waveguide. Simultaneously, the signal frequency becomes higher and the signal wavelength becomes shorter, and thus the strength of the dielectric layer may possibly be decreased if its thickness is adjusted to ¼ times the signal wavelength. In this case, by adjusting the thickness of the dielectric layer to ¾ times or {fraction (5/4)} times the signal wavelength, degradation in the strength of the dielectric layer can be prevented.

In the invention, it is preferable that the line conductor has a tip of its one end opened, and that a distance between the tip and the slot is adjusted to substantially (2n−1)/4 times (n=natural number) a wavelength of a signal transmitted through the high-frequency line.

According to the invention, when the tip of one end of the line conductor is opened and the distance between the tip and the slot is adjusted to substantially ¼ times a wavelength of a signal transmitted through the high-frequency line, a signal propagating through the high-frequency line (traveling wave) is totally reflected from the opened tip, and is thereby changed into a backward wave to be transmitted along the opposite direction. At this time, since the tip is opened, a current is inhibited from flowing at the tip, and, in this part, the backward-wave current is phase-inverted and reflected so as to cancel out the traveling-wave current. The traveling-wave current and the phase-inverted backward-wave current are combined with each other to form a standing wave having a node at the opened tip, its node pitch being one-half times as long as the signal wavelength. Here, since the distance between the opened tip and the slot is adjusted to ¼ times a signal wavelength, there occurs an antinode of the standing wave at a region immediately above the slot of the high-frequency line, and the current is maximized, resultantly a magnetic field produced by the current is maximized. This maximum magnetic field is shifted to the slot, and thereby satisfactory electromagnetic coupling can be achieved. Eventually, the signal is efficiently transmitted to the waveguide. At this time, by adjusting the distance between the opened tip and the slot to (2n−1)/4 times (n=natural number) a signal wavelength, the slot is located at the antinode of the standing wave composed of a combination of traveling and backward waves. Thus, it is possible to achieve the same effects as achieved in the case where the distance between the opened tip and the slot is adjusted to ¼ times a signal wavelength.

According to the invention, when the front end of the high-frequency line is opened and the distance between the opened front end and the slot is adjusted to (2n−1)/4 times (n=natural number) a signal wavelength, the standing wave, composed of a combination of a traveling wave propagating through the high-frequency line and a backward wave reflected from the opened front end, becomes most intense in magnetic field in the region of the slot. This makes it possible to achieve optimum electromagnetic coupling between the high-frequency line and the slot through the magnetic field, resulting in the high-frequency line-waveguide conversion efficiency being enhanced.

In the invention, it is preferable that the line conductor has a tip of its one end short-circuited with the grounding conductor layer, and that a distance between the tip and the slot is adjusted to substantially (n−1)/2 times (n=natural number) a wavelength of a signal transmitted through the high-frequency line.

According to the invention, when the line conductor has the tip of its one end short-circuited with the grounding conductor layer, and the distance between the tip and the slot is adjusted to substantially ½ times a wavelength of a signal transmitted through the high-frequency line, a signal propagating through the high-frequency line (traveling wave) is totally reflected from the short-circuited tip, and is thereby changed into a backward wave to be transmitted along the opposite direction. At this time, since the tip is short-circuited, the maximum current flows at the tip, and, in this part, the backward-wave current is reflected, with its phase being identical with that of the traveling-wave current. The traveling-wave current and the phase-uninverted backward-wave current are combined with each other to form a standing wave having an antinode at the opened tip, its antinode pitch being one-half times as long as the signal wavelength. Here, since the distance between the short-circuited tip and the slot is adjusted to ½ times a signal wavelength, the antinode of the standing wave occurs at a region immediately above the slot of the high-frequency line, and the current is maximized, accordingly a magnetic field produced by the current is maximized. This maximum magnetic field is shifted to the slot, and thereby satisfactory electromagnetic coupling can be achieved. Eventually, the signal is efficiently transmitted to the waveguide. At this time, by adjusting the distance between the short-circuited tip and the slot to (n−1)/2 times (n=natural number) a signal wavelength, the slot is located at the antinode of the standing wave composed of a combination of traveling and backward waves. Thus, it is possible to achieve the same effects as achieved in the case where the distance between the short-circuited tip and the slot is adjusted to ½ times a signal wavelength.

According to the invention, when the front end of the high-frequency line is short-circuited by the grounding conductor layer and the distance between the short-circuited front end and the slot is adjusted to (n−1)/2 times (n=natural number) a signal wavelength, the standing wave, composed of a combination of a traveling wave propagating through the high-frequency line and a backward wave reflected from the short-circuited front end, becomes most intense in magnetic field in the region of the slot. This makes it possible to achieve optimum electromagnetic coupling between the high-frequency line and the slot through the magnetic field, resulting in the high-frequency line-waveguide conversion efficiency being enhanced.

In the invention, it is preferable that the dielectric layer is made of at least one of inorganic dielectric materials selected from the group consisting of aluminum oxide ceramics, aluminum nitride ceramics, and glass ceramic materials.

According to the invention, the dielectric layer is made of at least one of inorganic dielectric materials selected from the group consisting of aluminum oxide ceramics, aluminum nitride ceramics, and glass ceramic materials. Since such a material has a small dielectric loss tangent and lends itself to hermetic sealing of the mounted high-frequency components, the reliability of the high-frequency components can be enhanced.

In the invention, it is preferable that the shielding through conductors are located inwardly relative to the opening of the waveguide.

According to the invention, since the shielding through conductors are located inwardly relative to the opening of the waveguide, no unnecessary resonance is caused therein. Moreover, the shielding through conductors can be formed in the interior of the dielectric layer concurrently with the top-surface line conductor and the grounding conductor layer. This eliminates the need for an extra process to form the shielding conductor portion on the side surface of the dielectric layer. Besides, since there is no need to conform the contour of the dielectric layer to the opening of the waveguide, the high-frequency line-waveguide converter can be produced with ease. Further, the region of the dielectric layer that is surrounded by the shielding conductor portion can be shaped arbitrarily. Thus, for example, even if unnecessary resonance occurs in the region of the dielectric layer that is surrounded by the shielding conductor portion, the unnecessary resonance can be shifted to outside the signal conversion band by adjusting the arrangement of the shielding conductor portion.

According to the invention, there is provided the high-frequency line-waveguide converter which provides high conversion efficiency but incurs less variation in conversion characteristics.

BRIEF DESCRIPTION OF THE DRAWINGS

Other and further objects, features, and advantages of the invention will be more explicit from the following detailed description taken with reference to the drawings wherein:

FIG. 3B showing a sectional view taken on the line III—III of FIG. 3A; and FIG. 3C showing a bottom view;

FIG. 8B showing a sectional view taken on the line VIII—VIII of FIG. 8A; and FIG. 8C showing a bottom view.

DETAILED DESCRIPTION OF THE PREFERRED EMBODIMENTS

Figure 1A:
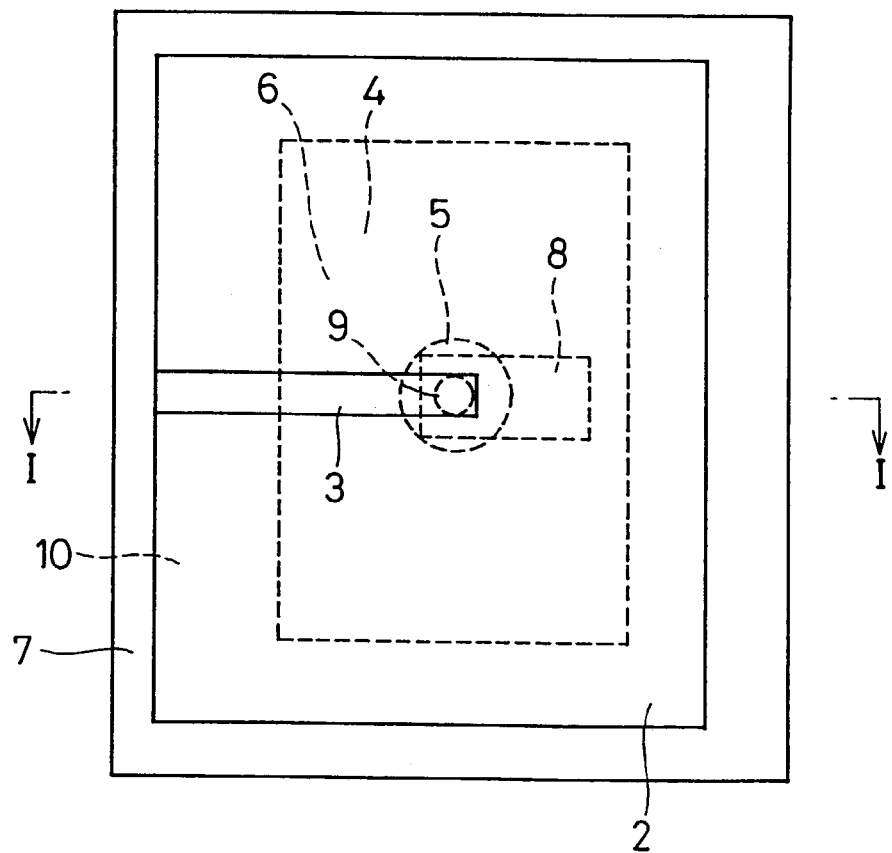
FIG. 1A is a plan view showing a first embodiment of a high-frequency line-waveguide converter according to the invention.

Now referring to the drawings, preferred embodiments of the invention are described below.

Figure 1B:
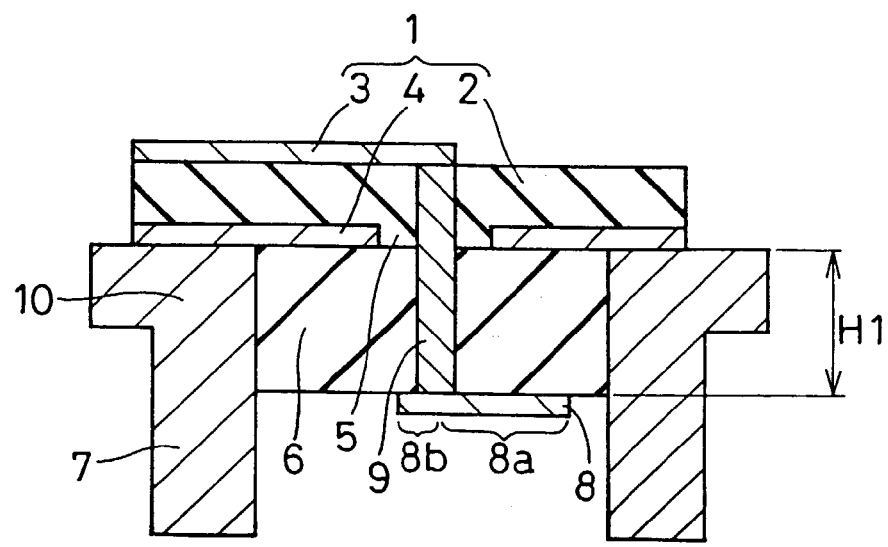
FIG. 1B is a sectional view taken on the line I—I of FIG. 1A.
Figure 2A:
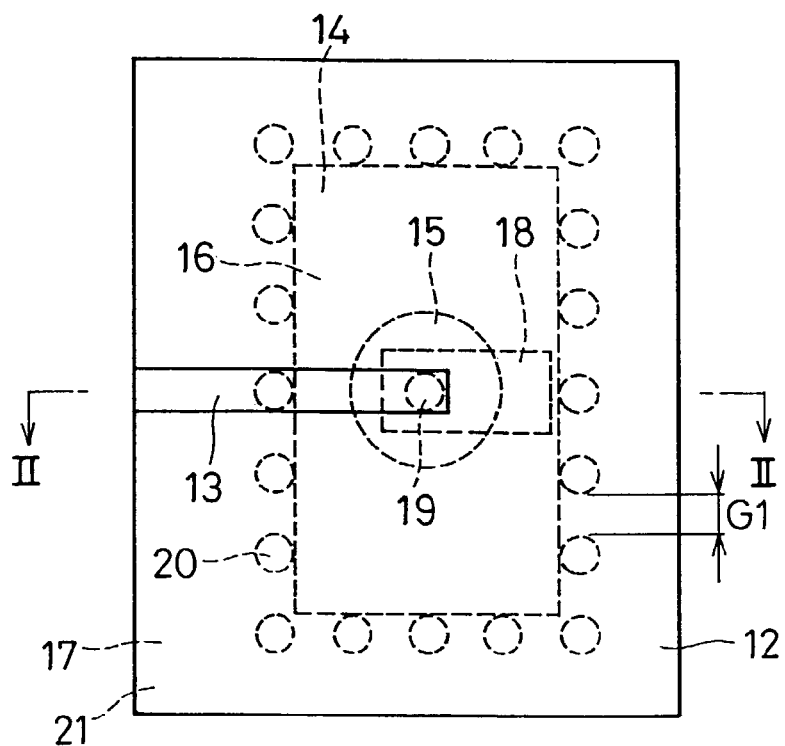
FIG. 2A is a plan view showing a second embodiment of the high-frequency line-waveguide converter according to the invention.
Figure 2B:
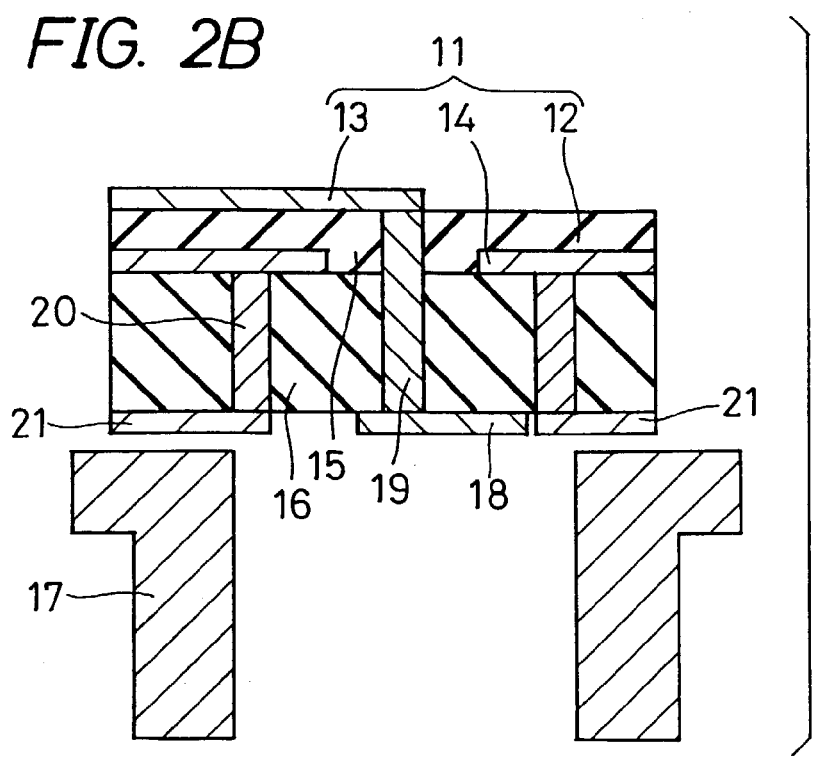
FIG. 2B is a sectional view taken on the line II—II of FIG. 2A.

FIGS. 1A and 1B are views of the first embodiment of the high-frequency line-waveguide converter according to the invention, with FIG. 1A showing a plan view and FIG. 1B showing a sectional view taken on the line I—I of FIG. 1A. FIGS. 2A and 2B are views of the second embodiment of the high-frequency line-waveguide converter according to the invention, with FIG. 2A showing a plan view and FIG. 2B showing a sectional view taken on the line II—II of FIG. 2A. In FIGS. 1A, 1B, 2A, and 2B, reference numeral 1, 11 represents a micro-strip line acting as a high-frequency line; 2, 12 represents a first dielectric layer; 3, 13 represents a line conductor; 4, 14 represents a grounding conductor; 5, 15 represents an opening portion formed in the grounding conductor 4, 14; 6, 16 represents a second dielectric layer; 7, 17 represents a waveguide; 8, 18 represents a radiating conductor; 9, 19 represents a connecting conductor; and 10, 20 represents a shielding conductor portion.

In the high-frequency line-waveguide converter embodying the invention, the micro-strip line 1, 11, acting as a high-frequency line, is composed of the first dielectric layer 2, 12; the line conductor 3, 13 disposed on one surface, specifically, the top surface of the first dielectric layer 2, 12; and the grounding conductor 4, 14 formed on the other surface, specifically, the bottom surface of the first dielectric layer 2, 12. Moreover, stacked below the first dielectric layer 2, 12 and the grounding conductor 4, 14 is the second dielectric layer 6, 16, and disposed on the bottom surface of the second dielectric layer 6, 16 is the radiating conductor 8, 18. The radiating conductor 8, 18 is electrically connected to one end of the line conductor 3, 13 by the connecting conductor 9, 19 passing through the opening portion 5, 15 formed in the grounding conductor 4, 14. With this arrangement, a high-frequency signal transmitted to the line conductor 3, 13 is emitted from the radiating conductor 8, 18 as an electromagnetic wave, and then radiated into the waveguide 7, 17 which is so arranged as to extend downwardly of the radiating conductor 8, 18. Part of the connecting conductor 9, 19 that passes through the second dielectric layer 6, 16, and the radiating conductor 8, 18 are shielded by the shielding conductor portion 10, 20 which is disposed on a side surface or in an interior of the second dielectric layer 6, 16 so as to surround them. The shielding conductor portion 10, 20 is electrically connected to the grounding conductor 4, 14 and the waveguide 7, 17. By this shielding, it is possible to prevent leakage of an electromagnetic wave radiated from the radiating conductor 8, 18 toward the grounding conductor 4, 14 and the electromagnetic wave reflected from the grounding conductor 4, 14, i.e. reflected wave. This helps prevent degradation of conversion efficiency. The waveguide 7, 17 is arranged and connected in such a way that within its opening is arranged the radiating conductor 8, 18.

With such a structure, the thickness of the dielectric layer constituting the micro-strip line 1, 11, i.e. the high-frequency line, and the distance between the radiating conductor 8, 18 and the grounding conductor 4, 14 can be independently adjusted in accordance with the thickness of the first dielectric layer 2, 12 and the thickness of the second dielectric layer 6, 16, respectively. This helps facilitate impedance adjustment to the micro-strip line 1, 11. In addition, the conductor width of the line conductor 3, 13 can be adjusted to the level suitable for connection with an external high-frequency line, and also the distance between the radiating conductor 8, 18 and the grounding conductor 4, 14 can be so adjusted that the high-frequency line-waveguide conversion efficiency is enhanced.

Moreover, assuming that the signal frequency is increased (signal wavelength is decreased), in this case, even if the thickness of the second dielectric layer 6, 16 is reduced to enhance the high-frequency line-waveguide conversion efficiency, since the thickness of the entire converter is equal to the sum of the thicknesses of the first and second dielectric layers 2, 12 and 6, 16, it does not happen that the converter is made unduly thin as a whole. Thus, degradation of its strength can be prevented.

Further, the radiating conductor 8, 18 is wholly arranged within the opening of the waveguide 7, 17. Thus, even if the high-frequency line-waveguide converter undergoes positional deviation with respect to the waveguide 7, 17, since the length of part of the radiating conductor 8, 18 that functions as an antenna is maintained constant, no characteristics degradation takes place. In addition, since the line conductor 3, 13 and the radiating conductor 8, 18 can be connected to each other without forming a notch or the like in the opening of the waveguide 7, 17, it never occurs that an electromagnetic wave leaks from the notch of the opening of the waveguide 7, 17. Thus, no degradation in conversion efficiency is caused due to leakage of an electromagnetic wave.

The examples of dielectric materials used for the first and second dielectric layers 2, 12 and 6, 16 include: ceramic materials predominantly composed of aluminum oxide, aluminum nitride, silicon nitride, mullite, or the like; glass materials; glass ceramic materials obtained by firing a mixture of glass and ceramic filler; organic resin materials such as fluorine resin typified by epoxy resin, polyimide resin, or tetrafluoroethylene resin; and organic resin-ceramics (including glass) composites.

The examples of conductor materials used for the line conductor 3, 13, the grounding conductor 4, 14, the radiating conductor 8, 18, the connecting conductor 9, 19, and the shielding conductor portion 10, 20 constituted by a through conductor, etc. include: metallized materials predominantly composed of tungsten, molybdenum, gold, silver, copper, or the like; and metal foil materials predominantly composed of gold, silver, copper, aluminum, or the like.

In particular, when the high-frequency line-waveguide converter is incorporated in a wiring board having high-frequency components mounted therein, the first and second dielectric layers 2, 12 and 6, 16, should preferably be made of a dielectric material which has a small dielectric tangent and lends itself to hermetic sealing. At least one of inorganic materials selected from the group consisting of aluminum oxide ceramics, aluminum nitride ceramics, and glass ceramics can be taken up as a particularly preferable dielectric material. Employing such a hard material is desirable in terms of enhancement of the reliability of the mounted high-frequency components, because the dielectric tangent is small and the high-frequency components can be hermetically sealed. In this case, in terms of sealability and productivity, it is preferable to use, as a conductor material, a metallized conductor which can be fired together with a dielectric material at one time.

The high-frequency line-waveguide converter embodying the invention is fabricated as follows. In a case of using sintered aluminum oxide as a dielectric material, firstly, a suitable organic composition or solvent is mixedly added to powder of a starting material such as aluminum oxide, silicon oxide, magnesium oxide, or calcium oxide, to form a slurry. The slurry is then formed into ceramic green sheets by means of the conventionally-known doctor blade method or calendar roll method. Moreover, a suitable organic composition or solvent is mixedly added to powder of a starting material, for example high melting point metal such as tungsten or molybdenum, aluminum oxide, silicon oxide, magnesium oxide, or calcium oxide, to form a metallized paste. Secondly, the ceramic green sheet is subjected to, for example, a stamping process to form therein a through hole for constituting a through conductor acting as the connecting conductor 9, 19 or the shielding conductor portion 10, 20 shown in FIGS. 2A and 2B. The metallized paste is buried in the through hole, and is then subjected to, for example, a printing method, to print configurations of the line conductor 3, 13, the grounding conductor 4, 14, and the radiating conductor 8, 18. Subsequently, the ceramic green sheets carrying the conductors are stacked in layers, are press-bonded to one another, and are fired at a high temperature (approximately 1600° C.). Further, the exposed conductor such as the line conductor 3, 13 or the radiating conductor 8, 18 has its surface plated with nickel and gold.

The shielding conductor portion 10, 20 is disposed on the side surface or in the interior of the second dielectric layer 6, 16 so as to surround part of the connecting conductor 9, 19 that passes through the second dielectric layer 6, 16, and the radiating conductor 8, 18. The shielding conductor portion 10, 20 is electrically connected to the grounding conductor 4, 14 before being grounded.

FIGS. 1A and 1B show the case where the shielding conductor portion 10 is formed on the side surface of the second dielectric layer 6. In this case, although the tubular wall at the end of the waveguide 7 serves also as the shielding conductor portion 10, the shielding conductor portion 10 may alternatively be constituted by a metallized layer formed on the side surface of the second dielectric layer 6. In the latter case, the metallized layer on the side surface is so formed as to be electrically connected to the waveguide 7. The connection between the metallized layer on the side surface and the waveguide 7 can be established by locating the opening of the waveguide 7 on the undersurface of the second dielectric layer 6. However, to minimize the possibility of electromagnetic-wave leakage, as shown in FIGS. 1A and 1B, the waveguide 7 should preferably be arranged such that the second dielectric layer 6 has its undersurface located inwardly relative to the opening of the waveguide 7. Moreover, formation of the metallized layer on the side surface of the second dielectric layer 6 is achieved as follows in accordance with the above-described producing method. After the ceramic green sheets are press-bonded to one another to form a laminated body, a metallized paste is print-coated on part of the side surface of the laminated body that acts as the second dielectric layer 6. In the alternative, after firing, the side surface of the second dielectric layer 6 is subjected to, for example, grinding, and thereafter a metallized paste is printed on the side surface.

As shown in FIGS. 2A and 2B, the shielding conductor portion 20 is constituted by a plurality of shielding through conductors disposed in the interior of the second dielectric layer 16. In the example shown in FIGS. 2A and 2B, a plurality of shielding through conductors are arranged in rows in the interior of the second dielectric layer 16 so as to surround the radiating conductor 18 and the connecting conductor 19, thereby constituting the shielding conductor portion 20. At this time, the shielding through conductors should preferably be located inwardly relative to the opening of the waveguide 17. This helps prevent occurrence of unnecessary resonance. By composing the shielding conductor portion 20 of a plurality of shielding through conductors, the shielding conductor portion 20 can be formed in the interior of the second dielectric layer 16 concurrently with the connecting conductor 19. This eliminates the need for an extra process to form the shielding conductor portion 20 on the side surface of the second dielectric layer 16. Thus, in contrast to the example shown in FIGS. 1A and 1B, there is no need to conform the contour of the second dielectric layer 16 to the opening of the waveguide 17, whereby making it possible to produce the high-frequency line-waveguide converter with ease. Moreover, the region of the second dielectric layer 16 that is surrounded by the shielding conductor portion 20 can be shaped arbitrarily. Thus, for example, even if unnecessary resonance occurs in the region of the second dielectric layer 16 that is surrounded by the shielding conductor portion 20, the unnecessary resonance can be shifted to outside the signal conversion band by adjusting the arrangement of the shielding conductor portion 20.

It is preferable that a gap between the adjacent shielding through conductors (indicated by reference symbol G1 in FIG. 2A) is set to be less in length than ¼ times a signal wavelength. This is because, by doing so, an electromagnetic wave is less prone to leaking from the gap between the adjacent shielding through conductors, and thereby the shielding effect can be enhanced.

Note that the shielding conductor portion 20 is not limited to the shielding through conductor, but may be of a so-called through hole conductor formed by a conductor layer on an inner wall of a through hole, or a so-called via conductor formed by filling an interior of a through hole with a conductor.

In order to enhance the high-frequency line-waveguide conversion efficiency, the second dielectric layer 6, 16 should preferably have a thickness of substantially ¼ times of a signal wavelength of a signal transmitted through the micro-strip line 1, 11 (indicated by reference symbol H1 in FIG. 1B). By adjusting the thickness of the second dielectric layer 6, 16 to substantially ¼ times a signal wavelength, the distance between the radiating conductor 8, 18 and the grounding conductor 4, 14 becomes substantially quarter times as long as the signal wavelength, and the length of the double optical path, through which an electromagnetic wave radiated from the radiating conductor 8, 18 toward the grounding conductor 4, 14 is totally reflected from the grounding conductor 4, 14 and then returns to the radiating conductor 8, 18, becomes substantially one-half times as long as the signal wavelength. Accordingly, the returned wave has been phase-inverted. Being subjected to phase inversion when totally reflected from the grounding conductor 4, 14, the wave becomes identical in phase with the electromagnetic wave radiated from the radiating conductor 8, 18 directly toward the waveguide 7, 17. These waves are combined with each other, so that the signal is efficiently transmitted to the waveguide 7, 17.

The thickness of the second dielectric layer 6, 16 can be adjusted, in accordance with the above-described producing method, by changing the thickness of the ceramic green sheet body which is formed into the second dielectric layer 6, 16 after firing. In this case, the adjustment can be made either by changing the thickness of a single piece of ceramic green sheet or by stacking a plurality of ceramic green sheets.

The connecting conductor 9, 19 is preferably connected to the radiating conductor 8, 18 at a position offset from the center thereof, that is, for example, a position offset therefrom along the transmission direction of the high-frequency line 1, 11. By so doing, as shown in FIG. 1B for example, the radiating conductor 8 is separated by the connecting conductor 9 into two portions: a longer portion 8a and a shorter portion 8b. Since the longer and shorter portions 8a and 8b of the radiating conductor 8 extend in opposite directions with respect to the point of connection with the connecting conductor 9, when signals are transmitted from the point of connection toward the front ends of the longer and shorter portions 8a and 8b of the radiating conductor 8 respectively, the resultant electromagnetic waves are in phase opposition because of the opposite signal transmission directions. The electromagnetic waves in phase opposition cancel each other out. Moreover, the intensity of the to-be-radiated electromagnetic wave corresponds to the length of the longer and shorter portions 8a and 8b of the radiating conductor 8. Thus, in response to the difference in length between the longer and shorter portions 8a and 8b of the radiating conductor 8, an intense electromagnetic wave is radiated into the waveguide 7. Hence, by connecting the connecting conductor 9 to the radiating conductor 8 at a position deviated from the center thereof, the electromagnetic wave radiated from the longer portion 8a of the radiating conductor 8 is more intense than that radiated from the shorter portion 8b of the radiating conductor 8. Upon this difference in intensity, the electromagnetic wave is intensely radiated into the waveguide 7 accordingly; wherefore conversion from the high-frequency line 1 to the waveguide 7 can be achieved. Moreover, it is more preferable that the connecting conductor 9 is connected to the end of the radiating conductor 8 so that the radiating conductor 8 extends from the point of connection in only one direction. Because, in this case, since the difference in length between the longer and shorter portions 8a and 8b of the radiating conductor 8 is maximized, optimum conversion efficiency can be secured. By contrast, if the connecting conductor 9 is connected to the radiating conductor 8 at the center thereof, the longer and shorter portions 8a and 8b are identical in length. Therefore, in the radiating conductor 8, electromagnetic waves which are more of the same in intensity but are in phase opposition cancel each other out, whereby making it difficult to radiate an electromagnetic wave into the waveguide 7 efficiently. This is true of the second embodiment of the invention shown in FIGS. 2A and 2B.

The opening portion 5, 15 (FIGS. 1A, 1B, 2A, 2B, 3A, and 3B) formed in the grounding conductor 4, 14 is so located as to face one end of the line conductor 3, 13 to provide electrical insulation between the connecting conductor 9, 19 and the grounding conductor 4, 14. The size of the opening portion 5, 15 is preferably determined in such a way that the gap between the connecting conductor 9, 19 and the grounding conductor 4, 14 falls within a range from the thickness of the first dielectric layer 2, 12 for constituting the micro-strip line 1, 11 to equal to or less than quarter times of a signal wavelength. If the gap between the connecting conductor 9, 19 and the grounding conductor 4, 14 is smaller than the thickness of the first dielectric layer 2, 12, an impedance mismatch between the connecting conductor 9, 19 and the micro-strip line 1, 11 tends to take place. On the other hand, if the gap between the connecting conductor 9, 19 and the grounding conductor 4, 14 exceeds ¼ times of a signal wavelength, an electromagnetic wave tends to leak from the gap.

No particular limitation is imposed on the configuration of the waveguide 7, 17. For example, the use of the WR series (EIA (Electronic Industries Alliance) standard) standardized as a rectangular waveguide is desirable in terms of easy evaluation of various properties, because of its substantial calibration kits for measurement. Also usable is a rectangular waveguide which is down-sized, while making sure not to cause a higher-order mode, to make the system smaller in size and lighter in weight in accordance with a frequency of a high-frequency signal to be used. Further, a circular waveguide may also be used.

The waveguide 7, 17 is made of metal, and preferably has its tubular inner wall coated with precious metal, such as gold or silver, to reduce a conductor loss caused by a current and to prevent corrosion. It may also be made of resin molded into a required waveguide shape, and have its tubular inner wall coated with precious metal such as gold or silver, as in the case of using metal. The waveguide 7, 17 is attached to the high-frequency line-waveguide converter by bonding using a brazing filler material, or by clamping using a screw.

In order to attach the waveguide 17 to the high-frequency line-waveguide converter by bonding using a brazing filler material, a waveguide connecting conductor is preferably formed that conforms to the opening of the waveguide 17 to be attached. The waveguide connecting conductor is electrically connected to the grounding conductor 14 and the shielding conductor portion 20. For example, as shown in FIGS. 2A and 2B, a waveguide connecting conductor 21 made of a metallized layer is formed on the undersurface of the second dielectric layer 16 so as to be connected to the shielding conductor portion 20 constituted by a shielding through conductor. Also in the case where the shielding conductor portion 20 is constituted by a metallized layer formed on the side surface of the second dielectric layer 16, the metallized layer-made waveguide connecting conductor 21 is preferably formed on the undersurface of the second dielectric layer 16 so as to be connected to the side-surface metallized layer acting as the shielding conductor portion 20. Formation of such a waveguide connecting conductor 21 is preferable in terms of enhancement of the reliability of the high-frequency line-waveguide converter. Because, when the waveguide 17 is attached to the high-frequency line-waveguide converter, the electrical connection between the waveguide 17 and the shielding conductor portion 20 as well as the grounding conductor 14 can be established more reliably.

In the example shown in FIGS. 1A and 1B, part of the grounding conductor 4, exposed on the surface of the first dielectric layer 2 in the vicinity of the second dielectric layer 6, functions as the waveguide connecting conductor.

The waveguide connecting conductor 21 as shown in. FIGS. 2A and 2B is formed basically in the same manner as in the formation of the line conductor 13, the grounding conductor 14, and the radiating conductor 18, that is, formed simultaneously by printing a metallized paste in the configuration of the waveguide connecting conductor 21. Moreover, it is preferable that, like the exposed conductor such as the line conductor 13 or the radiating conductor 18, the waveguide connecting conductor 21 has its surface plated with nickel and gold. This helps enhance the wettability of the brazing filler material used in the case of bonding.

It is to be understood that the application of the invention is not limited to the specific embodiments described heretofore, and that many modifications and variations of the invention are possible within the spirit and scope of the invention.

For example, in the examples shown in FIGS. 1A, 1B, 2A, and 2B, although a micro-strip line structure is employed as the high-frequency line, it is also possible to employ instead a coplanar line structure or a triplet line structure. The coplanar line structure is realized by forming a coplanar grounding conductor on the top surface of the first dielectric layer 2, 12, with a certain gap secured on each side of the line conductor 3, 13 to obtain an impedance of predetermined value. The triplet line structure is realized as follows. A dielectric layer is additionally stacked on the first dielectric layer 2, 12, and, on the top surface of this dielectric layer is formed a top-surface grounding conductor so as to cover the line conductor 3, 13. The top-surface grounding conductor is arranged so as to face the grounding conductor 4, 14 on the undersurface of the first dielectric layer 2, 12. In either case, by making the positional relationship among the first dielectric layer 2, 12; the line conductor 3, 13; the grounding conductor 4, 14; the opening portion 5, 15; the second dielectric layer 6, 16; the waveguide 7, 17; the radiating conductor 8, 18; and the connecting conductor 9, 19 substantially the same as that in the examples shown in FIGS. 1A and 1B, and 2A and 2B, the same effect can be attained.

EXAMPLE

Next, the following experiments are conducted to confirm the effect exerted by the high-frequency line-waveguide converter embodying the invention.

Figure 3A:
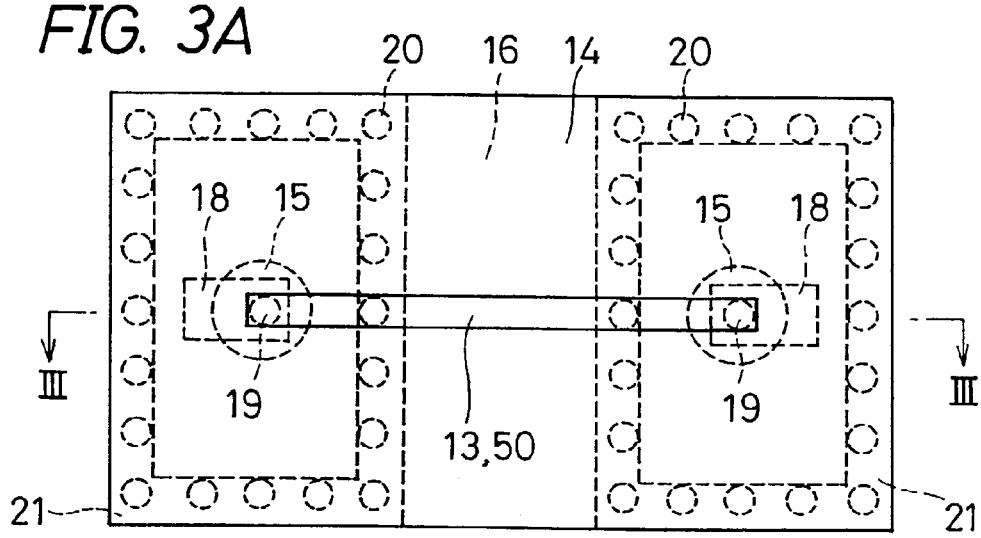
FIGS. 3A through 3C are views of an evaluative substrate for the high-frequency line-waveguide converter according to the invention, with FIG. 3A showing a top view.
Figure 3B:
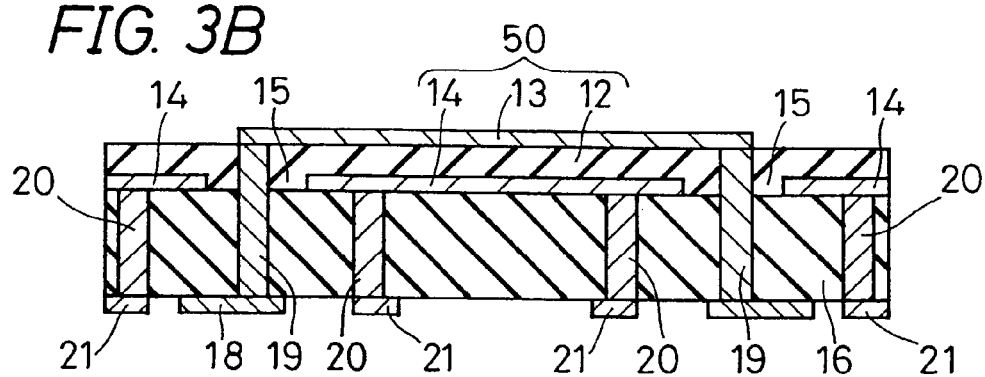
Figure 3C:
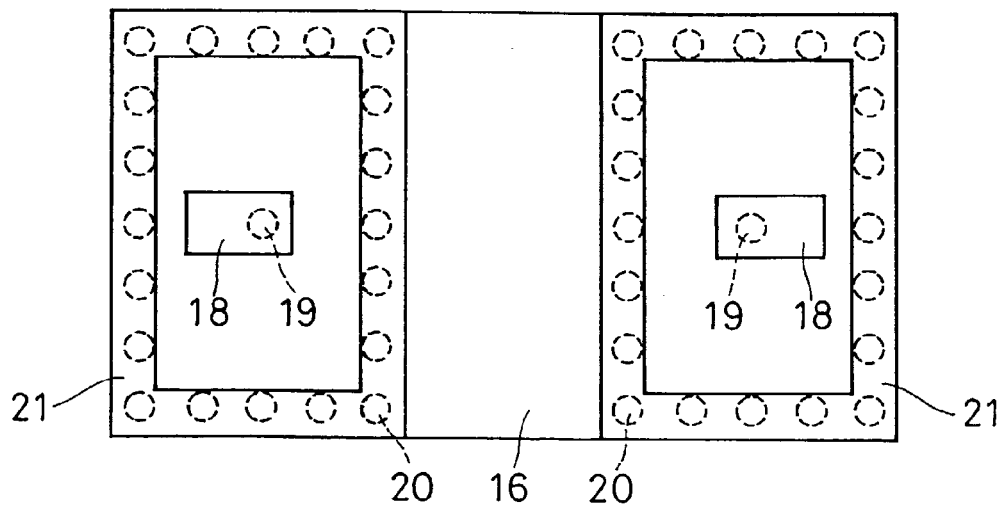

At first, using an alumina-ceramics green sheet whose dielectric loss tangent is 0.0006 at 10 GHz after firing and a metallized paste for tungsten metallization, an evaluative substrate as shown in FIG. 3 is fabricated by means of ordinary green-sheet laminating technique and simultaneous firing technique. Note that FIG. 3A is a top view of the evaluative substrate; FIG. 3B is a sectional view taken on the line III—III of FIG. 3A; and FIG. 3C is a bottom view.

After firing, nickel and gold plating is applied to the surfaces of the metallized layers formed on the top and bottom surfaces, respectively, of the evaluative substrate. Here, the high-frequency line-waveguide converter incorporated in the evaluative substrate is so designed that its corresponding waveguide is of a WR-10 waveguide for use in the W-band (75 to 110 GHz) and that 76 GHz is defined as the center frequency. The evaluative substrate incorporates, on its right and left sides as viewed in the figure, two pieces of the high-frequency line-waveguide converters embodying the invention that are each composed of the first dielectric layer 12; the line conductor 13; the grounding conductor 14; the second dielectric layer 16; the radiating conductor 18; the connecting conductor 19; and the shielding conductor portion 20 constituted by a shielding through conductor, as shown in FIGS. 2A and 2B. These two converters have their line conductors 13, as well as the grounding conductors 14, integrated with each other. The integrated line conductor and grounding conductor 13 and 14 constitute, together with the dielectric layer 12, a connecting micro-strip line 50. The interval between the right- and left-hand high-frequency line-waveguide converters is set at 20 mm, so that a measurement waveguide can be connected to each of the converters. That is, the evaluative substrate is constructed by connecting two high-frequency line-waveguide converters to each other by the connecting micro-strip line 50 having a length of 20 mm.

Next, in the evaluative substrate, the measurement waveguide is disposed so that its waveguide opening faces the waveguide connecting conductor 21 of the high-frequency line-waveguide converter, and they are connected to each other by clamping using a screw. Subsequently, an insertion loss as observed in a frequency range of 75 to 110 GHz is measured by a way of measuring a signal inputted to one waveguide and outputted from the other waveguide. Based on this measurement data and the already-measured loss of the connecting micro-strip line 50, a conversion loss of the high-frequency line-waveguide converter is estimated.

As a result, the conversion loss is found to be approximately 1 dB at 76 GHz. This figure has proved that the conversion loss is at a sufficiently low level where no problem arises in manufacture of a practical high-frequency module. Moreover, since the bandwidth is kept in a range from 75 to 85 GHz when a conversion loss of 1.5 dB is defined as a threshold value, it is seen that a relative band of 10% or more is obtained with respect to the designed center frequency of 76 GHz, and thus relatively broadband frequency characteristics can be confirmed.

Figure 4A:
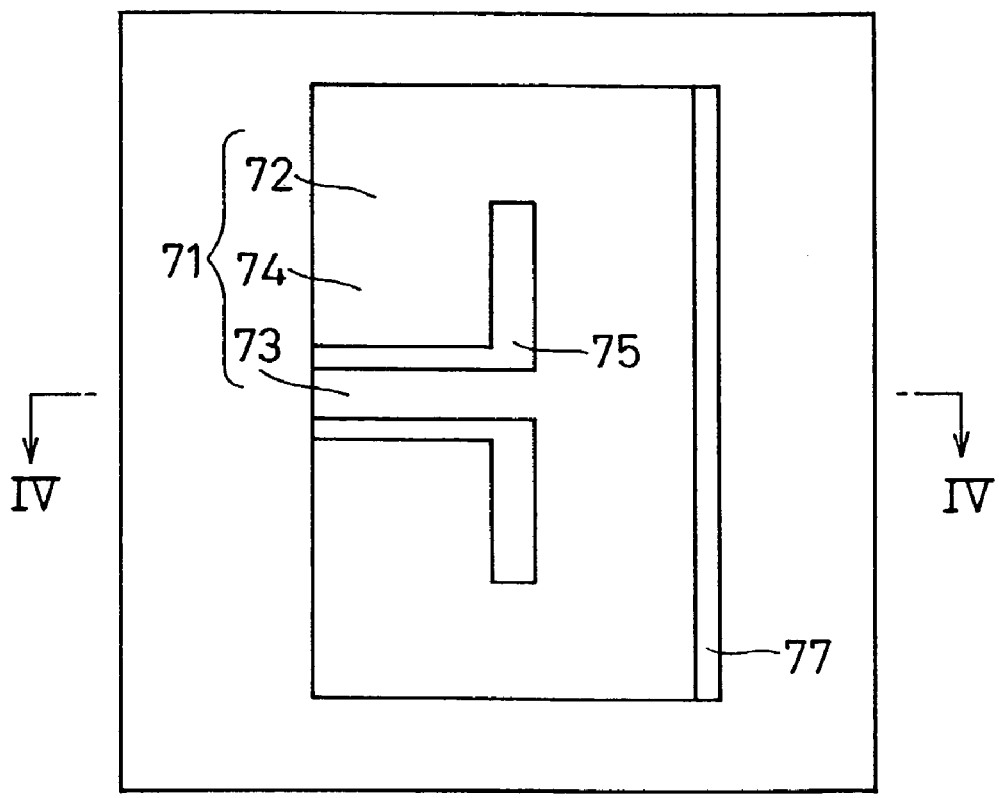
FIG. 4A is a plan view showing a third embodiment of the high-frequency line-waveguide converter according to the invention.
Figure 4B:
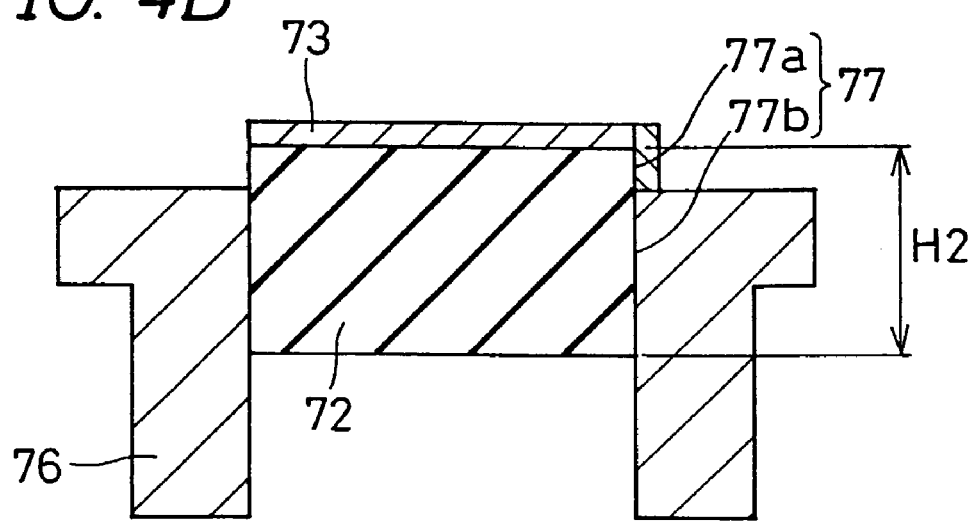
FIG. 4B is a sectional view taken on the line IV—IV of FIG. 4A.
Figure 5A:
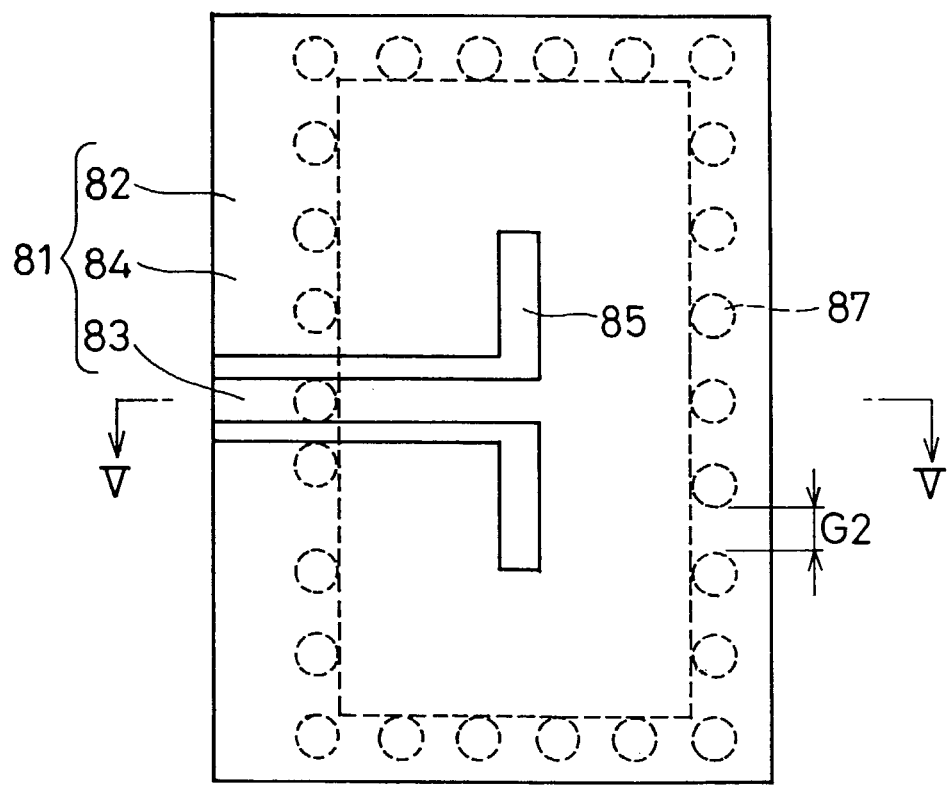
FIG. 5A is a plan view showing a fourth embodiment of the high-frequency line-waveguide converter according to the invention.
Figure 5B:
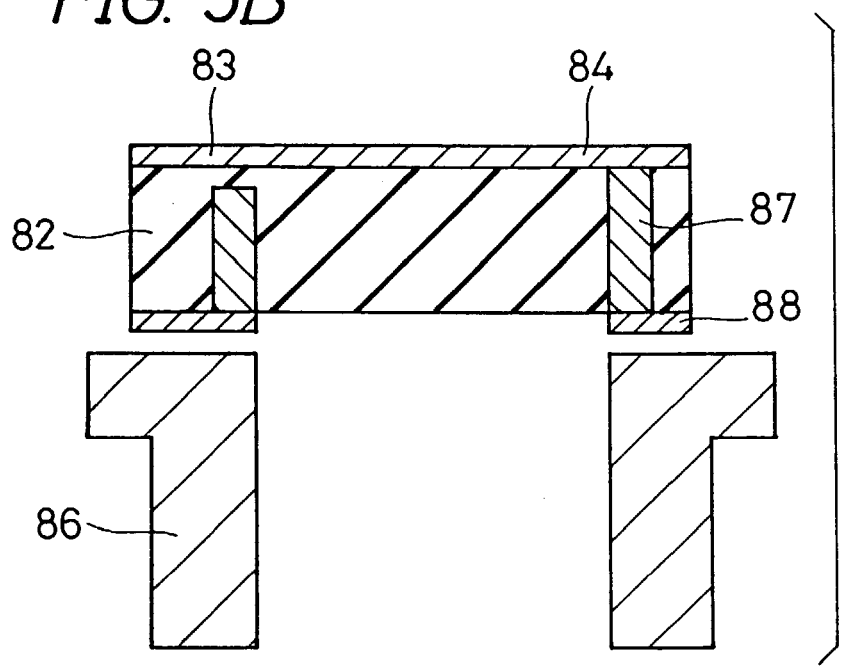
FIG. 5B is a sectional view taken on the line V—V of FIG. 5A.

FIGS. 4A and 4B are views of the third embodiment of the high-frequency line-waveguide converter according to the invention, with FIG. 4A showing a plan view and FIG. 4B showing a sectional view taken on the line IV—IV of FIG. 4A. FIGS. 5A and 5B are views of the fourth embodiment of the high-frequency line-waveguide converter according to the invention, with FIG. 5A showing a plan view and FIG. 5B showing a sectional view taken on the line V—V of FIG. 5A. In FIGS. 4A, 4B, 5A, and 5B, reference numeral 71, 81 represents a high-frequency line; 72, 82 represents a dielectric layer; 73, 83 represents a line conductor; 74, 84 represents a grounding conductor layer; 75, 85 represents a slot formed in the grounding conductor layer 74, 84; 76, 86 represents a waveguide; and 77, 87 represents a shielding conductor portion.

In the high-frequency line-waveguide converter embodying the invention, a coplanar line, acting as the high-frequency line 71, 81, is composed of the dielectric layer 72, 82; the line conductor 73, 83 disposed on one surface, specifically, the top surface of the dielectric layer 72, 82; and the grounding conductor layer 74, 84 formed on the same surface (the top surface of the dielectric layer 72, 82) so as to surround one end of the line conductor 73, 83. Moreover, on the grounding conductor layer 74, 84 formed on the top surface of the dielectric layer 72, 82 is disposed the slot 75, 85 substantially perpendicularly to one end of the line conductor 73, 83. The slot 75, 85 is electromagnetically connected to one end of the high-frequency line 71, 81. With this arrangement, a high-frequency signal transmitted to the high-frequency line 71, 81 is emitted from the slot 75, 85 and then radiated, as an electromagnetic wave, into the waveguide 76, 86 which is so arranged as to extend downwardly of the other surface, i.e. the undersurface of the dielectric layer 72, 82, so that its opening faces one end of the line conductor 73, 83 and the slot 75, 85.

The dielectric layer 72, 82 has its side surface shielded by the shielding conductor portion 77 disposed on the side surface of the dielectric layer 72 (refer to FIGS. 4A and 4B) or the shielding conductor portion 87 disposed in the interior of the dielectric layer 82 (refer to FIGS. 5A and 5B), so as to surround one end of the line conductor 73, 83 and the slot 75, 85. By this shielding, it is possible to prevent leakage of an electromagnetic wave radiated from the slot 75, 85 toward the dielectric layer 72, 82 and the electromagnetic wave reflected from the interface between the dielectric layer 72, 82 and the waveguide 76, 86. This helps prevent degradation of conversion efficiency.

With this structure, the line conductor and grounding conductor layer 73, 83 and 74, 84 constituting the coplanar line, i.e. the high-frequency line 71, 81, and the slot 75, 85 can be formed on the same plane. In this case, in contrast to the case where the line conductor and grounding conductor layer 73, 83 and 74, 84 and the slot 75, 85 are formed on different layers, no misalignment is caused between the components due to deviation in lamination. Thus, the electromagnetic coupling characteristics between the high-frequency line 71, 81 and the slot 75, 85 can be controlled with ease. The results in advantageously enhancing the high-frequency line-waveguide conversion efficiency and in suppressing variation in the conversion characteristics.

Another advantage is that the high-frequency line 71, 81 is composed of the line conductor 73, 83 formed on the top surface of the dielectric layer 72, 82 and the grounding conductor layer 74, 84, and also the line conductor and grounding conductor layer 73, 83 and 74, 84 constituting the high-frequency line 71, 81, and the slot 75, 85 are located on the same plane of the top surface of the dielectric layer 72, 82. Thus, the relative position between the high-frequency line 71, 81 and the slot 75, 85 can be externally examined with ease after assembly. Moreover, the relative position can be related to the manufacturing process so that excellent electromagnetic coupling characteristics are attained between the high-frequency line 71, 81 and the slot 75, 85. Further, by conducting examinations to reject defective components, the manufacturing yield can be enhanced and distribution of defective components can be prevented.

The examples of dielectric materials used for the dielectric layer 72, 82 include: ceramic materials predominantly composed of aluminum oxide, aluminum nitride, silicon nitride, mullite, or the like; glass materials; glass ceramic materials obtained by firing a mixture of glass and ceramic filler; organic resin materials such as fluorine resin typified by epoxy resin, polyimide resin, or tetrafluoroethylene resin; and organic resin-ceramics (including glass) composites.

The examples of conductor materials used for the line conductor 73, 83, the grounding conductor layer 74, 84, and the shielding conductor portion 77, 87 constituted by a through conductor, etc. include: metallized materials predominantly composed of tungsten, molybdenum, gold, silver, copper, or the like; and metal foil materials predominantly composed of gold, silver, copper, aluminum, or the like.

In particular, when the high-frequency line-waveguide converter is incorporated in a wiring board having high-frequency components mounted therein, the dielectric layer 72, 82 should preferably be made of a dielectric material which has a small dielectric tangent and lends itself to hermetic sealing. At least one of inorganic materials selected from the group consisting of aluminum oxide ceramics, aluminum nitride ceramics, and glass ceramics can be taken up as a particularly preferable dielectric material. Employing such a hard material is desirable in terms of enhancement of the reliability of the mounted high-frequency components, because the dielectric tangent is small and the high-frequency components can be hermetically sealed. In this case, in terms of sealability and productivity, it is preferable to use, as a conductor material, a metallized conductor which can be fired together with a dielectric material at one time.

The high-frequency line-waveguide converter embodying the invention is fabricated as follows. In a case of using sintered aluminum aside as a dielectric material, a suitable organic composition or solvent is mixedly added to powder of a starting material such as aluminum oxide, silicon oxide, magnesium oxide, or calcium oxide, to form a slurry. The slurry is then formed into ceramic green sheets by means of the conventionally-known doctor blade method or calendar roll method. Moreover, a suitable organic composition or solvent is mixedly added to powder of a starting material, for example high melting point metal such as tungsten or molybdenum, aluminum oxide, silicon oxide, magnesium oxide, or calcium oxide, to form a metallized paste. Secondly, the ceramic green sheet is subjected to, for example, a stamping process to form therein a through hole for constituting a through conductor acting as the shielding conductor portion 77, 87. The metallized paste is buried in the through hole, and is then subjected to, for example, a printing method, to print configurations of the line conductor 73,83 and the grounding conductor layer 74, 84 having the slot 75, 85. Subsequently, in a case where the dielectric layer 72, 82 has a laminated stricture composed of a plurality of dielectric layers, the ceramic green sheets carrying the buried and printed conductors are stacked in layers, are press-bonded to one another, and are fired at a high temperature (approximately 1600° C.). Further, the exposed conductor such as the line conductor 73, 83 or the grounding conductor layer 74, 84 has its surface plated with nickel and gold.

The shielding conductor portion 77, 87 is disposed on the side surface or in the interior of the dielectric layer 72, 82 so as to surround one end of the line conductor 73, 83 and the slot 75, 85. The shielding conductor portion 77, 87 is electrically connected to the grounding conductor layer 74, 84 before being grounded.

FIGS. 4A and 4B show the case where the shielding conductor portion 77 is formed on the side surface of the dielectric layer 72. The shielding conductor portion 77 includes a first shielding conductor portion 77a and a second shielding conductor portion 77b. The first shielding conductor portion 77a is so located as to cover the side surface of the line conductor 73 and part of the side surface of the dielectric layer 72. The second shielding conductor portion 77b is located on the rest part of the side surface of the dielectric layer 72. In this case, although the tubular wall at the end of the waveguide 76 serves also as the second shielding conductor portion 77b, the shielding conductor portion 77 may alternatively be constituted by a metallized layer formed on the side surface of the dielectric layer 72. In the latter case, the metallized layer on the side surface is so formed as to be electrically connected to the waveguide 76. The connection between the metallized layer on the side surface and the waveguide 76 can be established by locating the opening of the waveguide 76 on the undersurface of the dielectric layer 72. However, to minimize the possibility of electromagnetic-wave leakage, as shown in FIGS. 4A and 4B, the waveguide 76 should preferably be arranged such that the dielectric layer 72 has its undersurface located inwardly relative to the opening of the waveguide 76. Moreover, formation of the metallized layer on the side surface of the dielectric layer 72 is achieved as follows in accordance with the above-described producing method. After the ceramic green sheets are press-bonded to one another to form a laminated body, a metallized paste is print-coated on part of the side surface of the laminated body that acts as the dielectric layer 72. In the alternative, after firing, the side surface of the dielectric layer 72 is subjected to, for example, grinding, as required, and thereafter a metallized paste is printed on the side surface.

As shown in FIGS. 5A and 5B, the shielding conductor portion 87 is preferably constituted by a plurality of shielding through conductors disposed in the interior of the dielectric layer 82. In the example shown in FIGS. 5A and 5B, a plurality of shielding through conductors are arranged in rows in the interior of the dielectric layer 82 so as to surround one end of the line conductor 83 and the slot 85, thereby constituting the shielding conductor portion 87. At this time, the shielding through conductors should preferably be located inwardly relative to the opening of the waveguide 86. This helps prevent occurrence of unnecessary resonance. By composing the shielding conductor portion 87 of a plurality of shielding through conductors, the shielding conductor portion 87 can be formed in the interior of the dielectric layer 82 concurrently with the top-surface line conductor 83 and the grounding conductor layer 84. This eliminates the need for an extra process to form the shielding conductor portion 87 on the side surface of the dielectric layer 82. Thus, in contrast to the example shown in FIGS. 4A and 4B, there is no need to conform the contour of the dielectric layer 72 to the opening of the waveguide 76; wherefore the high-frequency line-waveguide converter can be produced with ease. Moreover, the region of the dielectric layer 82 that is surrounded by the shielding conductor portion 87 can be shaped arbitrarily. Thus, for example, even if unnecessary resonance occurs in the region of the dielectric layer 82 that is surrounded by the shielding conductor portion 87, the unnecessary resonance can be shifted to outside the signal conversion band by adjusting the arrangement of the shielding conductor portion 87.

It is preferable that a gap between the adjacent shielding through conductors (indicated by reference symbol G2 in FIG. 5A) is set to be less in length than ¼ times a signal wavelength. By doing so, an electromagnetic wave is less prone to leaking from the gap between the adjacent shielding through conductors, and thereby the shielding effect can be enhanced.

Note that the shielding conductor portion 87 is not limited to the shielding through conductor, but may be of a so-called through hole conductor formed by clothing a conductor layer on an inner wall of a through hole, or a so-called via conductor formed by filling an interior of a through hole with a conductor.

In order to enhance the high-frequency line-waveguide conversion efficiency, the dielectric layer 72, 82 should preferably have a thickness of substantially ¼ times a signal wavelength of a signal transmitted trough the high-frequency line 71, 81 (indicated by reference symbol 112 in FIG. 4B). By adjusting the thickness of the dielectric layer 72, 82 to substantially ¼ times a signal wavelength, the distance between the slot 75, 85 and the interface between the dielectric layer 72, 82 and the waveguide 76, 86 becomes substantially quarter times as long as the signal wavelength, and the length of the double optical path, through which a wave reflected from the interface between the dielectric layer 72, 82 and the waveguide 76, 86 (reflected wave) is totally reflected from the grounding conductor layer 74, 84 and then returns to the interface, becomes substantially one-half limes as long as the signal wavelength. Accordingly, the returned wave has been phase-inverted. Being subjected to phase inversion when totally reflected from the grounding conductor layer 74, 84, the wave becomes identical in phase with the direct wave transmitted from tie slot 75, 85 directly toward the interface. These waves are combined with each other, so that the signal is efficiently transmitted to the waveguide 76, 86. Note that, by adjusting the thickness of the dielectric layer 72, 82 to $(2n-1)/4$ times (u=natural number) a signal wavelength, the optical-path difference between the reflected and direct waves becomes substantially $(n-1)/2$ times as long as the signal wavelength, thereby attaining the same effect as is described above. Simultaneously, the signal frequency becomes higher and the signal wavelength becomes shorter, and thus the strength of the dielectric layer 72, 82 may possibly be decreased if its thickness is adjusted to $\frac{1}{4}$ times the signal wavelength. In this case, by adjusting the thickness of the dielectric layer 72, 82 to $\frac{3}{4}$ times or {fraction ($\frac{5}{4}$)} lines of the signal wavelength, degradation in the strength of the dielectric layer 72, 82 can be prevented.

The thickness of the dielectric layer 72, 82 can be adjusted, in accordance with the above-described producing method, by changing the thickness of the ceramic green sheet body which is formed into the dielectric layer 72, 82 after firing. In this case, the adjustment can be made either by changing the thickness of a single piece of ceramic green sheet or by stacking a plurality of ceramic green sheets.

Figure 6A:
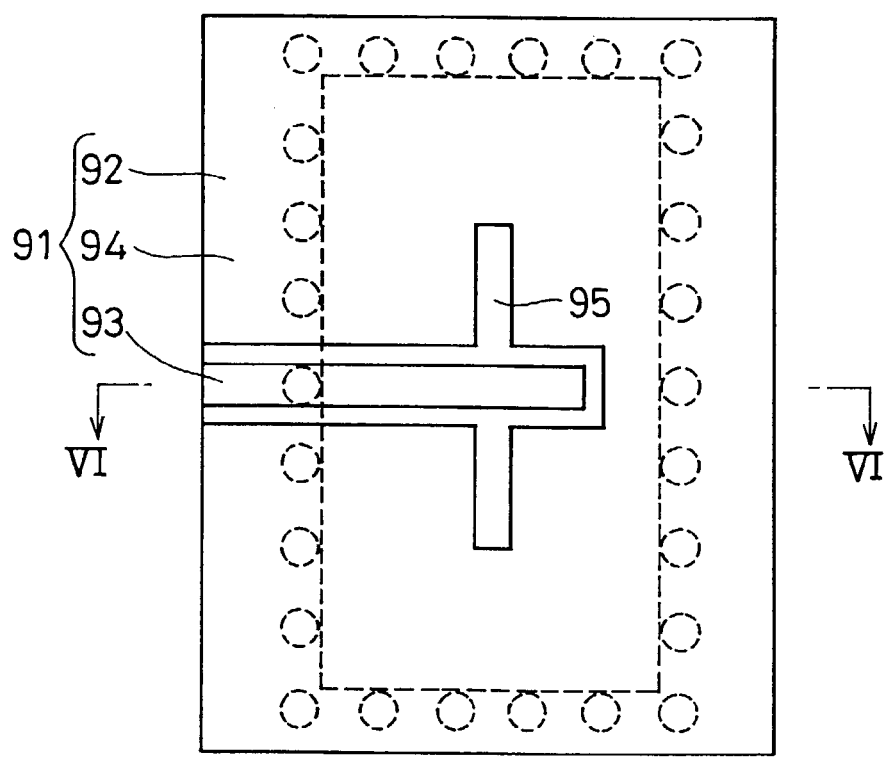
FIG. 6A is a plan view showing a fifth embodiment of the high-frequency line-waveguide converter according to the invention.
Figure 6B:
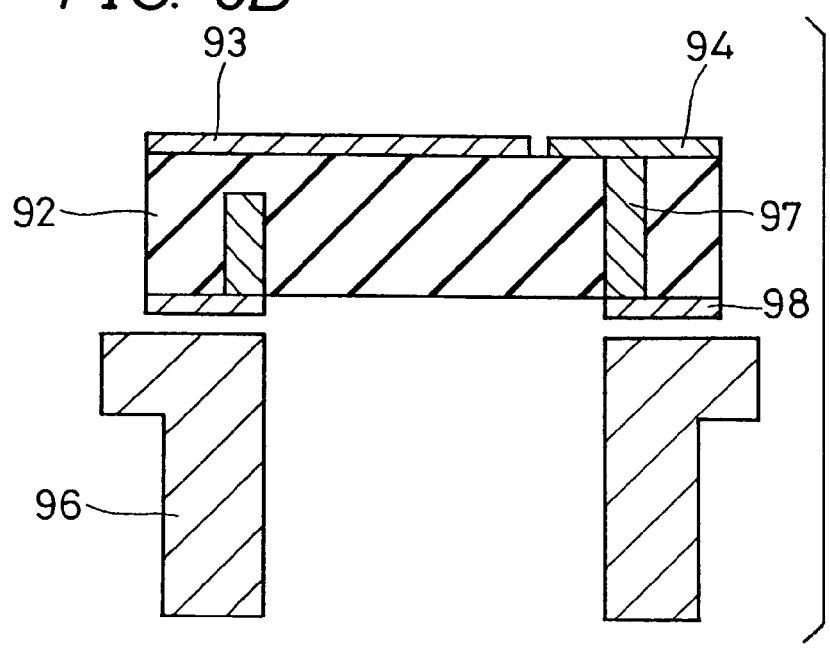
FIG. 6B is a sectional view taken on the line VI—VI of FIG. 6A.

Next, FIGS. 6A and 6B are views of the fifth embodiment of the high-frequency line-waveguide converter according to the invention, with FIG. 6A showing a plan view and FIG. 6B showing a sectional view taken on the line VI—VI of FIG. 6A. In FIGS. 6A and 6B, reference numeral 91 represents a coplanar line acting as a high-frequency line; 92 represents a dielectric layer; 93 represents a line conductor; 94 represents a grounding conductor layer; 95 represents a slot formed in the grounding conductor layer 94; 96 represents a waveguide; and 97 represents a shielding conductor portion.

In this example of the high-frequency line-waveguide converter embodying the invention, the coplanar line acting as the high-frequency line 91 has its front end opened. The distance between the opened front end and the center of the slot 95 is adjusted to $(2n-1)/4$ times (n=natural number) a signal wavelength. Thus, a standing wave, composed of a combination of a traveling wave propagating through the coplanar line and a backward wave reflected from the opened front end, becomes most intense in magnetic field in the region of the slot 95. This makes it possible to achieve optimum electromagnetic coupling between the coplanar line and the slot 95 through the magnetic field, resulting in the high-frequency line-waveguide conversion efficiency being enhanced.

Figure 7A:
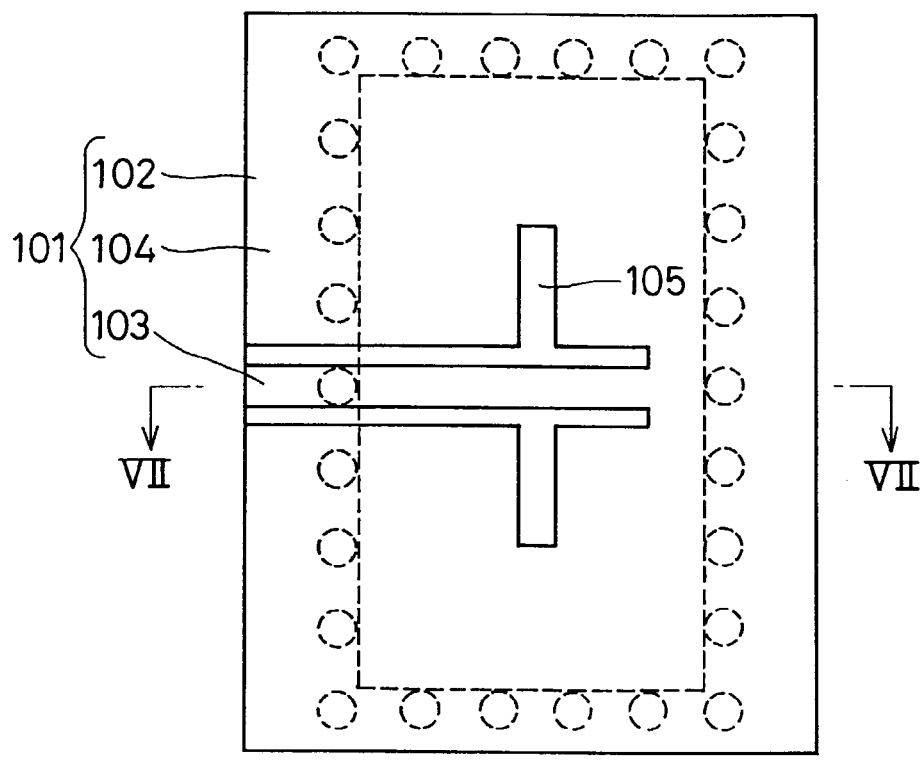
FIG. 7A is a plan view showing a sixth embodiment of the high-frequency line-waveguide converter according to the invention.
Figure 7B:
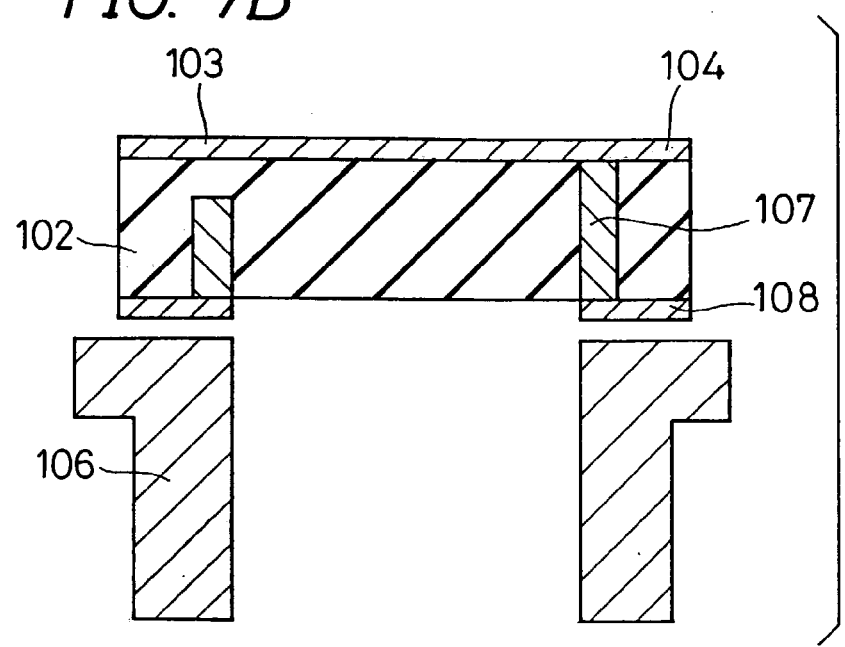
FIG. 7B is a sectional view taken on the line VII—VII of FIG. 7A.

Next, FIGS. 7A and 7B are views of the sixth embodiment of the high-frequency line-waveguide converter according to the invention, with FIG. 7A showing a plan view and FIG. 7B showing a sectional view taken on the line VII—VII of FIG. 7A. In FIGS. 7A and 7B, reference numeral 101 represents a coplanar line acting as a high-frequency line; 102 represents a dielectric layer; 103 represents a line conductor; 104 represents a grounding conductor layer; 105 represents a slot formed in the grounding conductor layer 104; 106 represents a waveguide; and 107 represents a shielding conductor portion.

In this example of the high-frequency line-waveguide converter embodying the invention, the coplanar line acting as the high-frequency line 101 has its front end short-circuited with the grounding conductor layer 104. The distance between the short-circuited front end and the center of the slot 105 is adjusted to $(n-1)/2$ times (n=natural number) a signal wavelength. Thus, a standing wave, composed of a combination of a traveling wave propagating through the coplanar line and a backward wave reflected from the short-circuited, front end, becomes most intense in magnetic field in the region of the slot 105. This makes it possible to achieve optimum electromagnetic coupling between the coplanar line and the slot 105 through the magnetic field, resulting in the high-frequency line-waveguide conversion efficiency being enhanced. Note that the examples shown in FIGS. 4A, 4B, 5A, and 5B correspond to this example provided that n is given as 1.

No particular limitation is imposed on the configuration of the waveguide 76, 86, 96, 106. For example, the use of the WR series standardized as a rectangular waveguide is desirable in terms of easy evaluation of various properties, because of its substantial calibration kits for measurement. Also usable is a rectangular waveguide which is down-sized, within the bounds of not causing a cutoff frequency in the waveguide, to make the system smaller in size and lighter in weight in accordance with a frequency of a high-frequency signal to be used. Further, a circular waveguide may also be used.

The waveguide 76, 86, 96, 106 is made of metal, and preferably has its tubular inner wall coated with precious metal, such as gold or silver, to reduce a conductor loss caused by a current and to prevent corrosion. It may also be made of resin molded into a required waveguide shape, and have its tubular inner wall coated with precious metal such as gold or silver, as in the case of using metal. The waveguide 76, 86, 96, 106 is attached to the high-frequency line-waveguide converter by bonding using a brazing filler material, or by clamping using a screw.

In order to attach the waveguide 86, 96, 106 to the high-frequency line-waveguide converter by bonding using a brazing filler material, a waveguide connecting conductor is preferably formed that conforms to the opening of the waveguide 86, 96, 106 to be attached. The waveguide connecting conductor is electrically connected to the grounding conductor layer 84, 94, 104 and the shielding conductor portion 87, 97, 107. For example, as shown in FIGS. 5A and 5B, a waveguide connecting conductor 88 made of a metallized layer is formed on the undersurface of the dielectric layer 82 so as to be connected to the shielding conductor portion 87 constituted by a shielding through conductor. Also in the case where the shielding conductor portion 87, 97, 107 is constituted by a metallized layer formed on the side surface of the dielectric layer 82, 92, 102, the metallized layer-made waveguide connecting conductor 88, 98, 108, as shown in FIGS. 5B, 6B, and 7B, is preferably formed on the undersurface of the dielectric layer 82, 92, 102 so as to be connected to the side-surface metallized layer acting as the shielding conductor portion 87, 97, 107. Formation of such a waveguide connecting conductor 88, 98, 108 is preferable in terms of enhancement of the reliability of the high-frequency line-waveguide converter. Because, when the waveguide 86, 96, 106 is attached to the high-frequency line-waveguide converter, the electrical connection between the waveguide 86, 96, 106 and the shielding conductor portion 87, 97, 107 as well as the grounding conductor layer 84, 94, 104 can be established more reliably.

The waveguide connecting conductor 88, 98, 108, as shown in FIGS. 5B, 6B, and 7B, is formed basically in the same manner as in the formation of the line conductor 73, 83, 93, 103 and the grounding conductor layer 74, 84, 94, 104, that is, formed simultaneously by printing a metallized paste in the configuration of the waveguide connecting conductor 88, 98, 108. Moreover, it is preferable that, like the exposed conductor such as the line conductor 73, 83, 93, 103 or the grounding conductor layer 74, 84, 94, 104, the waveguide connecting conductor 88, 98, 108 has its surface plated with nickel and gold. This helps enhance the wettability of the brazing filler material used in the case of bonding.

It is to be understood that the application of the invention is not limited to the specific embodiments described heretofore, and that many modifications and variations of the invention are possible within the spirit and scope of the invention.

For example, in the examples shown in FIGS. 4A, 4B, 5A, 5B, 6A, 6B, 7A, and 7B, although a coplanar line structure is employed as the high-frequency line, it is also possible to employ instead a coplanar line structure having a grounding conductor. The coplanar line structure having a grounding conductor is realized by forming a lower-surface grounding layer between the line conductor 73, 83, 93, 103 and the waveguide 76, 86, 96, 106. In the alternative, it can also be realized by additionally stacking a dielectric layer on the dielectric layer 72, 82, 92, 102, and forming, on the top surface of this dielectric layer, an upper-surface grounding conductor layer so as to cover the line conductor 73, 83, 93, 103. In either case, by making the positional relationship among the dielectric layer 72, 82, 92, 102; the line conductor 73, 83, 93, 103; the grounding conductor layer 74, 84, 94, 104; the slot 75, 85, 95, 105; the waveguide 76, 86, 96, 106; and the shielding conductor portion 77, 87, 97, 107 substantially the same as that in the example shown in FIGS. 4A and 4B, 5A and 5B, 6A and 6B, or 7A and 7B, the same effect can be attained.

Moreover, although the above-described embodiments deal with the case where sintered aluminum oxide is used as a dielectric material, sintered glass ceramics may be used instead. In this case, in accordance with the above-described producing method, at first powder of glass ceramics is prepared to form ceramic green sheets, and also powder of low melting point metal, such as silver, copper, or gold, is prepared to form a metallized paste. In addition, it is preferable to use an inorganic substance which does not substantially undergo sintering shrinkage at a temperature at which a glass ceramic material is sintered, for example, alumina. By applying alumina-made green sheets to both surfaces of a laminated body before firing, occurrence of firing shrinkage along the direction on the X-Y plane thereof can be prevented. Thus, dimensional variation of the ceramic wiring board attributed to firing shrinkage variation can be suppressed. This makes it possible to accomplish a high-frequency line-waveguide converter in which variation in the slot dimension and stub length can be suppressed further.

EXAMPLE

Next, the following experiments are conducted to confirm the effect exerted by the high-frequency line-waveguide converter embodying the invention.

Figure 8A:
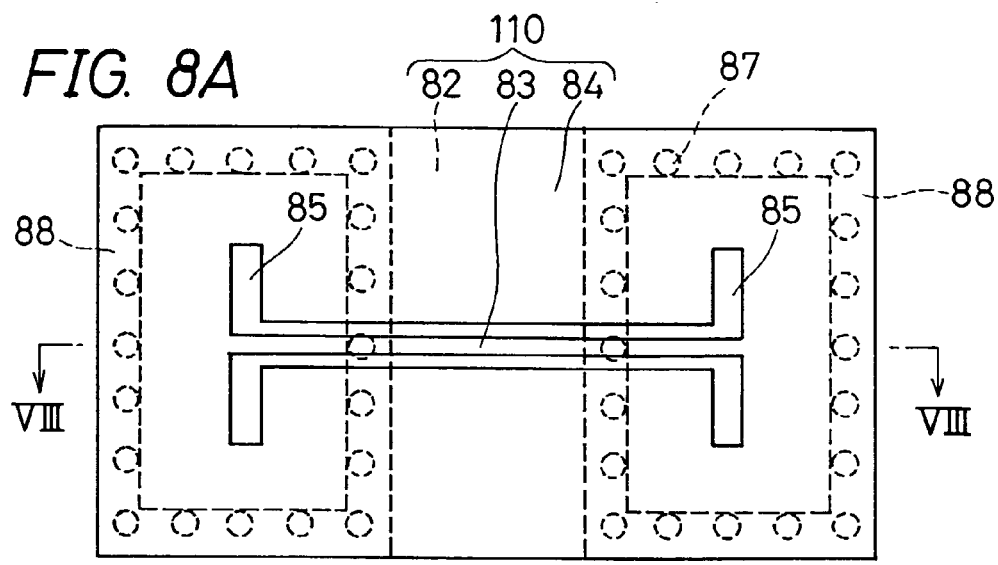
FIGS. 8A through 8C are views of an evaluative substrate for the high-frequency line-waveguide converter according to the invention, with FIG. 8A showing a top view.
Figure 8B:
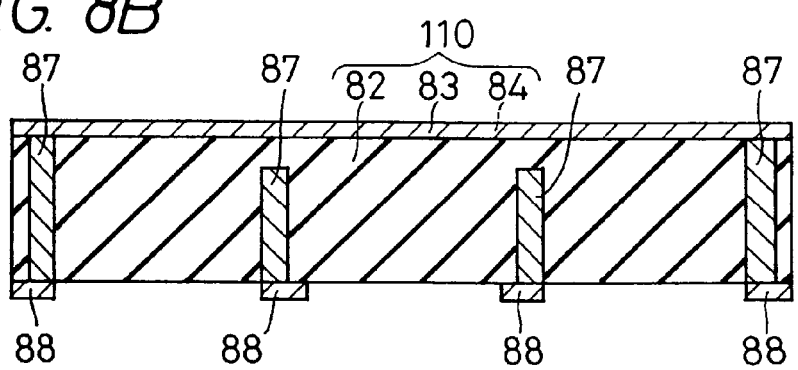
Figure 8C:
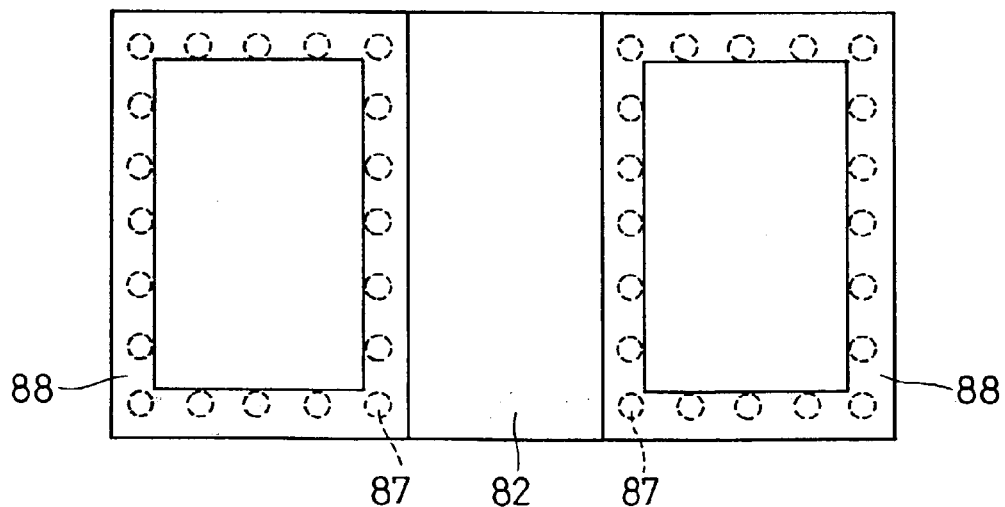
Figure 9:
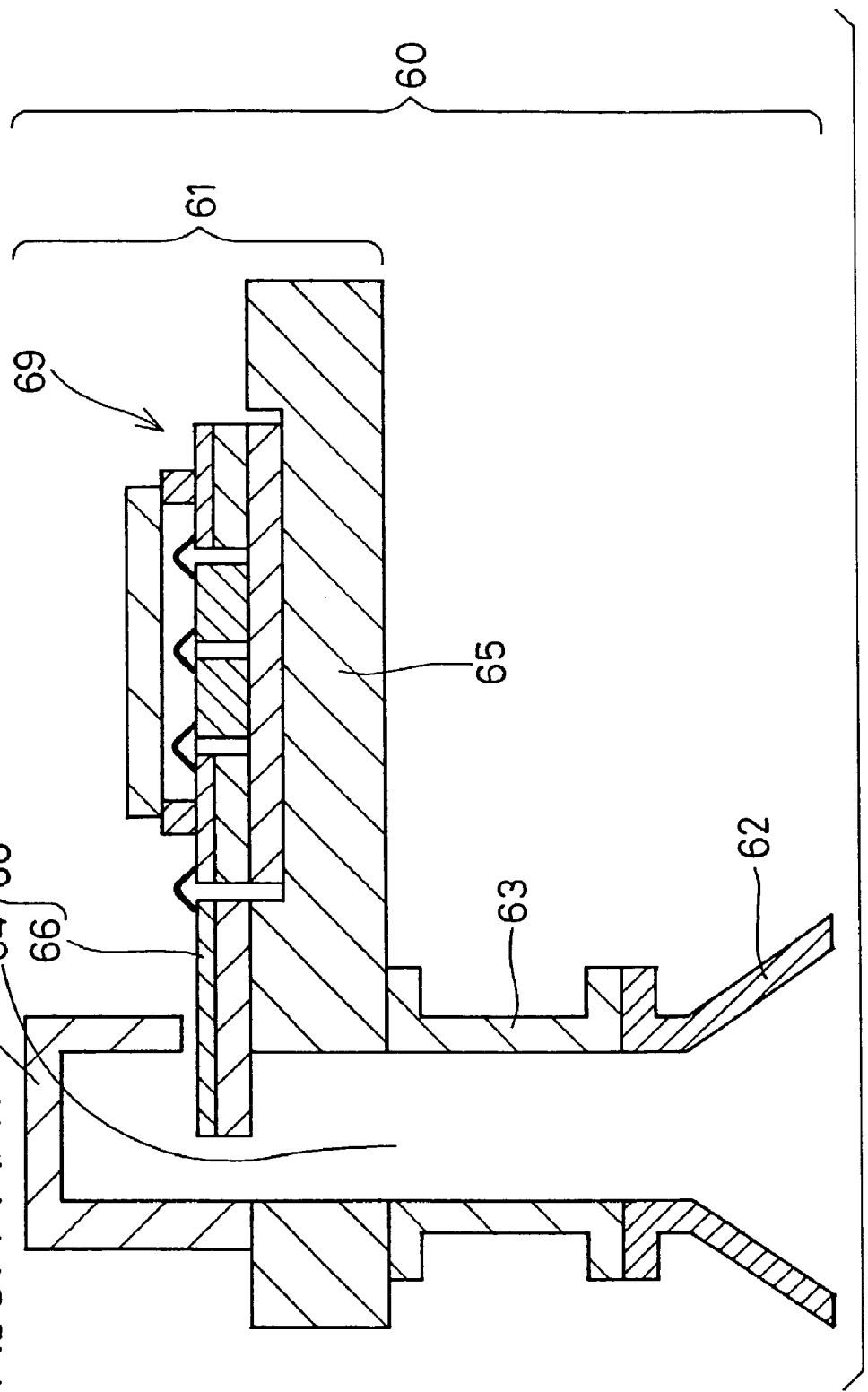
FIG. 9 is a sectional view showing an example of a conventional high-frequency line-waveguide converter.

At first, using an alumina-ceramics green sheet whose dielectric loss tangent is 0.0006 at 10 GHz after firing and a metallized paste for tungsten metallization, an evaluative substrate as shown in FIGS. 8A to 8C is fabricated by means of ordinary green-sheet laminating technique and simultaneous firing technique. Note that FIG. 8A is a top view of the evaluative substrate; FIG. 8B is a sectional view taken on the line VIII—VIII of FIG. 8A; and FIG. 8C is a bottom view.

After firing, nickel and gold plating is applied to the surfaces of the metallized layers formed on the top and bottom surfaces, respectively, of the evaluative substrate. Here, the high-frequency line-waveguide converter incorporated in the evaluative substrate is so designed that its corresponding waveguide is of a WR-10 waveguide for use in the W-band (75 to 110 GHz) and that 76 GHz is defined as the center frequency. The evaluative substrate incorporates, on its right and left sides as viewed in the figure, two pieces of the high-frequency line-waveguide converters embodying the invention that are each composed of the dielectric layer 82; the line conductor 83; the grounding conductor layer 84; the slot 85; the shielding conductor portion 87 constituted by a shielding through conductor; and the waveguide connecting conductor 88, as shown in FIGS. 5A and 5B. These two converters have their line conductors 83, as well as the grounding conductor layer 84, integrated with each other. The integrated line conductor and grounding conductor layer 83 and 84 constitute, together with the dielectric layer 82, a connecting coplanar line 110. The interval between the right- and left-hand high-frequency line-waveguide converters is set at 20 mm, so that a measurement waveguide can be connected to each of the converters. That is, the evaluative substrate is constructed by connecting two high-frequency line-waveguide converters to each other by the connecting coplanar line 110 having a length of 20 mm.

Next, in the evaluative substrate, the measurement waveguide is disposed so that its waveguide opening faces the waveguide connecting conductor 88 of the high-frequency line-waveguide converter, and they are connected to each other by clamping using a screw. Subsequently, an insertion loss as observed in a frequency range of 75 to 110 GHz is measured by a way of measuring a signal inputted to one waveguide and outputted from the other waveguide. Based on this measurement data and the already-measured loss of the connecting coplanar line 110, a conversion loss of the high-frequency line-waveguide converter is estimated.

As a result, the conversion loss is found to be approximately 0.7 dB at 76 GHz. This figure has proved that the conversion loss is at a sufficiently low level where no problem arises in manufacture of a practical high-frequency module.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency line-waveguide converter for convening a high-frequency line to a waveguide, comprising:
a high-frequency line including a first dielectric layer; a line conductor disposed on one surface of the first dielectric layer; and a grounding conductor disposed on the other opposite surface of the first dielectric layer,
an opening portion disposed in the grounding conductor so as to face one end of the line conductor;

a second dielectric layer stacked on the other surface of the first dielectric layer;

a radiating conductor disposed on one surface of the second dielectric layer so as to be opposite said one end of the line conductor;

a connecting conductor passing through the opening portion of the grounding conductor and penetrating through the first and second dielectric layers, for providing electrical connection between one end of the line conductor and one end of the radiating conductor;

a shielding conductor portion disposed on a side surface or in an interior of the second dielectric layer so as to surround part of the connecting conductor that passes through the second dielectric layer, and the radiating conductor; and a waveguide, wherein the one end of the line conductor is terminated at a position on the one surface of the first dielectric layer with the periphery of the opening portion, and the one end of the radiating conductor is terminated on the one surface of the second dielectric layer at a position facing the opening portion.

2. The high-frequency line-waveguide converter of claim 1, wherein the connecting conductor is connected to the radiating conductor at a position offset from a center thereof.

3. The high-frequency line-waveguide converter of claim 1, wherein a thickness of the second dielectric layer is substantially ¼ times of a wavelength of a signal transmitted through the high-frequency line.

4. The high-frequency line-waveguide converter of claim 1, wherein the first and second dielectric layers are each comprised of at least one inorganic dielectric material selected from the group consisting of aluminum oxide ceramics, aluminum nitride ceramics, and glass ceramic materials.

* * * * *